US006525817B1

United States Patent
Taniguchi et al.

(10) Patent No.: US 6,525,817 B1
(45) Date of Patent: Feb. 25, 2003

(54) INSPECTION METHOD AND APPARATUS FOR PROJECTION OPTICAL SYSTEMS

(75) Inventors: Tetsuo Taniguchi, Kanagawa-ken (JP); Toshihiko Tsuji, Chiba-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/667,754

(22) Filed: Sep. 21, 2000

Related U.S. Application Data

(62) Division of application No. 09/332,027, filed on Jun. 14, 1999, now Pat. No. 6,151,122, which is a division of application No. 09/253,711, filed on Feb. 22, 1999, now Pat. No. 6,169,602, which is a continuation of application No. 08/603,764, filed on Feb. 20, 1996, now abandoned.

(30) Foreign Application Priority Data

Feb. 21, 1995 (JP) .............................. 7-032245
Feb. 21, 1995 (JP) .............................. 7-032247

(51) Int. Cl.$^7$ .............................................. G01B 11/00
(52) U.S. Cl. ........................................................ 356/399
(58) Field of Search .......................... 356/399.401, 363, 356/356; 250/566, 548, 567, 561, 557

(56) References Cited

U.S. PATENT DOCUMENTS

| | | | |
|---|---|---|---|
| 4,629,313 A | 12/1986 | Tanimoto ..................... 355/53 |
| 4,657,379 A | 4/1987 | Suwa ........................... 355/53 |
| 4,666,273 A | 5/1987 | Shimizu et al. ............. 353/101 |
| 4,780,615 A | 10/1988 | Suzuki ....................... 250/548 |
| 4,829,193 A | 5/1989 | Nishi ......................... 250/548 |
| 4,871,237 A | 10/1989 | Anzai et al. |
| 4,880,310 A | 11/1989 | Nishi ......................... 356/401 |
| 4,897,553 A | 1/1990 | Nishi ......................... 250/548 |
| 4,943,733 A | 7/1990 | Mori et al. ................. 250/548 |
| 5,204,535 A | 4/1993 | Mizutani .................... 250/548 |
| 5,214,489 A | 5/1993 | Mizutani et al. ............ 356/363 |
| 5,406,373 A | 4/1995 | Kamon |
| 5,408,320 A | 4/1995 | Katagiri et al. |
| 5,414,514 A | 5/1995 | Smith et al. |

(List continued on next page.)

FOREIGN PATENT DOCUMENTS

| | | |
|---|---|---|
| JP | A-58-8353 | 1/1983 |
| JP | A-59-94032 | 5/1984 |
| JP | A-60-18738 | 1/1985 |
| JP | A-60-28613 | 2/1985 |
| JP | A-60-78457 | 5/1985 |
| JP | A-62-200724 | 9/1987 |
| JP | A-63-81818 | 4/1988 |

OTHER PUBLICATIONS

U.S. patent application No. 09/272,046 and its current claims, filed Mar. 19, 1999, by Kazuya Ota.
U.S. patent application No. 09/272,568 and its current claims, filed Mar. 19, 1999, by Kazuya Ota.
U.S. patent application No. 09/671,741 and its current claims, filed Sep. 29, 2000, by Kazuya Ota.

*Primary Examiner*—Michael P. Stafira
(74) *Attorney, Agent, or Firm*—Oliff & Berridge PLC

(57) ABSTRACT

The present invention relates to a method of detecting an image formation characteristic of a projection optical system for projecting a reference pattern on a reticle on a substrate. According to the detection method, a reticle stage is moved so that a reference mark on the reticle comes to a first reference position and a second reference position, and a wafer stage is moved so that a light transmission portion on the wafer stage crosses an image forming position of a projected image of the reference mark obtained through the projection optical system. The positions of the reticle stage and the wafer stage at the first and second reference positions are measured as moved distances of the stages, respectively. From the distances of movement of the reticle and wafer stages measured, the image formation characteristic of the projection optical system is calculated.

45 Claims, 13 Drawing Sheets

U.S. PATENT DOCUMENTS

| | | |
|---|---|---|
| 5,506,684 A | 4/1996 | Ota et al. |
| 5,528,027 A | 6/1996 | Mizutani |
| 5,646,413 A | 7/1997 | Nishi |
| 5,661,546 A | 8/1997 | Taniguchi |
| 5,871,237 A | 2/1999 | Anzai et al. ............... 281/21.1 |
| 6,018,384 A | 1/2000 | Ota ............................. 355/53 |
| 6,151,122 A | 11/2000 | Taniguchi et al. .......... 356/399 |
| 6,169,602 B1 | 1/2001 | Taniguchi et al. .......... 356/390 |
| 6,236,448 B1 | 5/2001 | Ota |
| 6,249,336 B1 | 6/2001 | Ota |

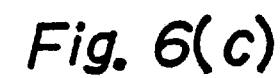
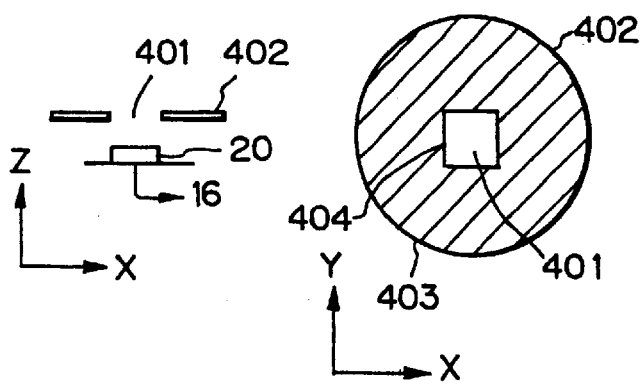
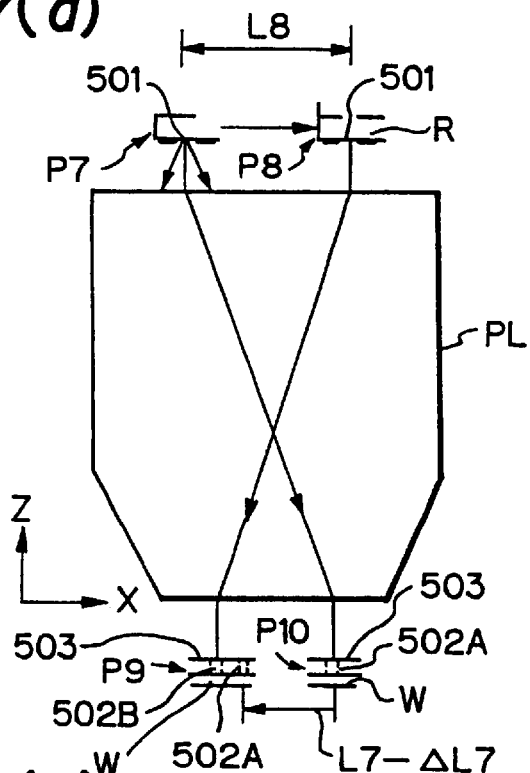
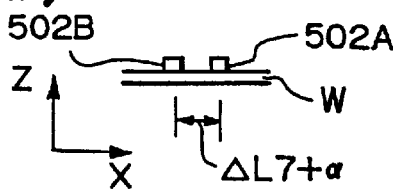

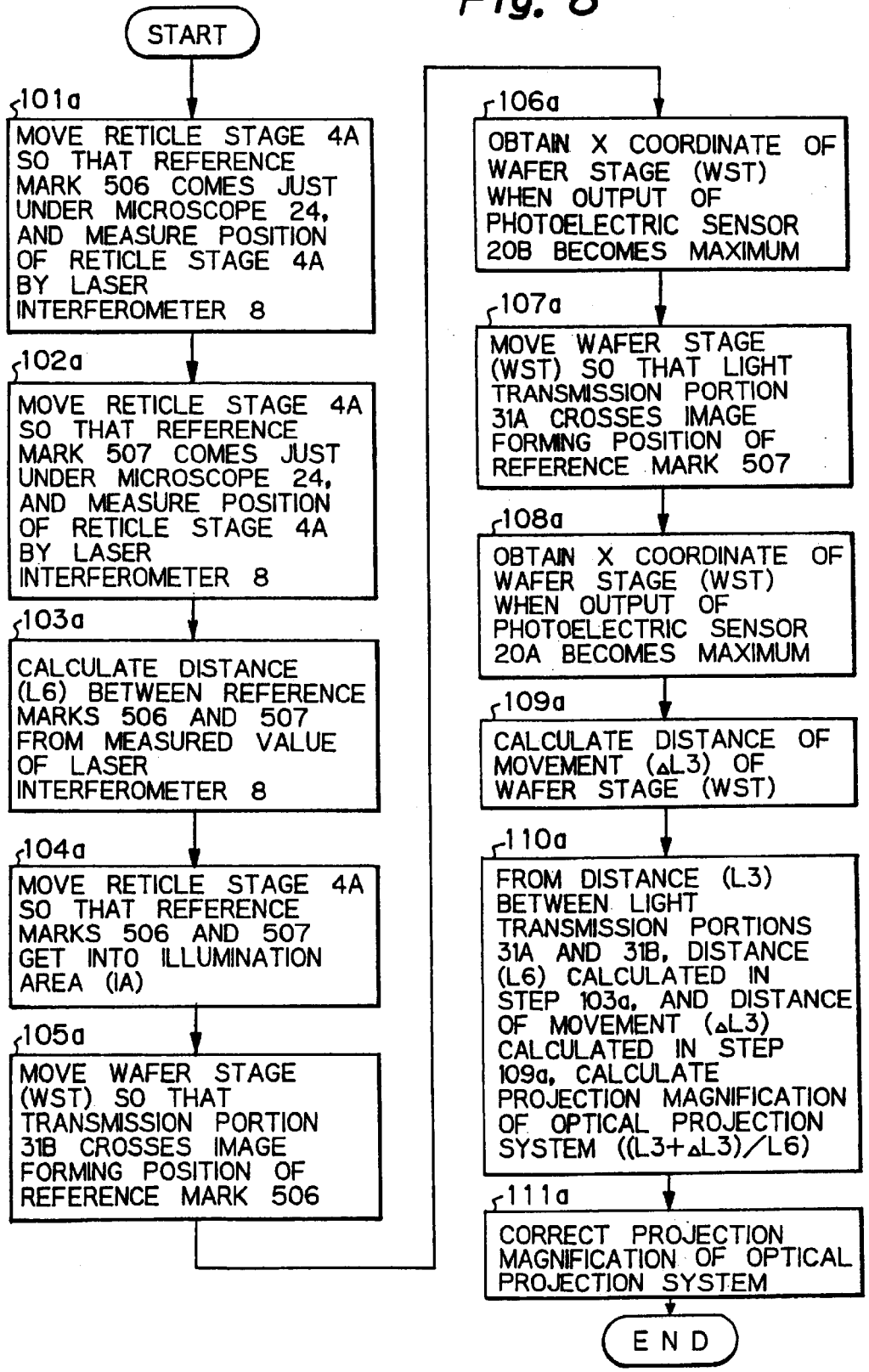

INSPECTION METHOD AND APPARATUS FOR PROJECTION OPTICAL SYSTEMS

This application is a divisional of prior application Ser. No. 09/332,027, filed Jun. 14, 1999 now U.S. Pat. No. 6,151,122, which is a divisional of prior application Ser. No. 09/253,711, filed Feb. 22, 1999 now U.S. Pat. No. 6,169,602, which is a continuation of prior application Ser. No. 08/603,764 filed Feb. 20, 1996 now abandoned.

BACKGROUND OF THE INVENTION

1. Field of the Invention

The present invention relates to an inspection method for a projection optical system, which requires highly accurate image formation characteristics, for fabricating semiconductor integrated circuits or liquid crystal devices, and also relates to an inspection apparatus for carrying out the inspection method and a projection exposure system provided with the inspection apparatus. The invention is applicable to a stepper type projection exposure apparatus but is particularly suitable for a projection exposure apparatus of the scan exposure type, such as a slit-scan type or step-and-scan type, where patterns of geometric shapes on a mask are serially transferred on a photosensitive substrate while scanning in synchronization the mask and the substrate.

2. Description of the Related Art

Projection optical systems, which are mounted, for example, in a projection exposure apparatus for fabricating semiconductor integrated circuits or liquid crystal devices, require extremely high accuracy with respect to image formation characteristics such as projection magnification and image distortion. For this reason, a method for measuring projection magnification and image distortion of the projection optical system with high accuracy and a correction method for correcting the image formation characteristics with high accuracy have been developed. At present, there are roughly two methods for measuring projection magnification and image distortion.

The first method is one which transfers a pattern of a test mask to a photosensitive substrate (e.g., wafer). This method is disclosed, for example, in Japanese Patent Laid-Open Publication No. Sho 58-8353. In the first method, the test mask pattern is transferred onto a photosensitive substrate, and after the photosensitive substrate is moved a predetermined distance in accordance with a laser interferometer, the pattern is again transferred onto the substrate so that it overlaps with the previously transferred pattern. After development of the substrate, the overlap error or registration error is measured. At this time, since marks overlap one above the other after the photosensitive substrate is moved, the marks are patterns drawn at different places on the test mask.

The second method is one where an image of a pattern formed on a photosensitive substrate is measured directly by a photoelectric sensor without an actual exposure process such as the first method. This second method is disclosed, for example, in Japanese Patent Laid-Open Publication Nos. Sho 59-94032 or Sho 60-18738. An example of the second method will be briefly described in reference to FIGS. 1(a) and 1(b).

FIG. 1(a) shows a schematic structure of an example of a conventional projection exposure apparatus. As shown in FIG. 1(a), a test reticle TR as a test mask is provided with a plurality of light transmission portions 305A to 305B (in this example, slits) formed at predetermined intervals. Illumination light passes through the light transmission portions 305A to 305G and forms an image thereof on the photosensitive substrate side through a projection optical system PL. FIG. 1(a) shows the arrangement of a pattern plate 301 and a photoelectric sensor 302 (both of which are positioned on an image forming position of the light transmission portion 305A). The pattern plate 301 has a very small light transmission portion 306 which serves as a mark detection device. The photoelectric sensor 302 receives the illumination light from the light transmission portion 306. The pattern plate 301 and the photoelectric sensor 302 are mounted on a wafer stage, which has the photosensitive substrate mounted thereon and is movable on a plane perpendicular to an optical axis of the projection optical system PL. The position of the wafer stage is precisely measured by a reflector 303 fixed to the wafer stage and an external laser interferometer 304. The output of the photoelectric sensor 302 varies by scanning the wafer stage.

FIG. 1(b) shows a graph representing the result of the output of the photoelectric sensor 302. In the figure, the axis of abscissa represents a position x of the scanning direction of the wafer stage, and the axis of ordinate represents an output value I of the photoelectric sensor 302. The image forming position of the light transmission portion 305A of the test reticle TR can be measured by obtaining, in FIG. 1(b), a position $x_0$ where the output value I of an output curve 307 becomes maximum. If a similar measurement is performed with respect to a plurality of light transmission portions of the test reticle TR, the respective image forming positions of the light transmission portions 305A to 305G will be obtained. Therefore, the projection magnification and the image distortion of the projection optical system can be obtained because the positions of the light transmission portions 305A to 305G are known in advance.

In addition to the aforementioned photoelectric sensor scanning method, there is known a method where an image of a pattern on a reticle is magnified with a microscope and is detected by mean of an image pick-up device, such as two-dimensional CCD, or a method where, conversely, illumination light is emitted from a slit provided on a wafer stage and is received via a pattern of a test reticle TR by scanning the wafer stage (see Japanese Patent Laid-Open Publication No. Sho 63-81818).

The image formation characteristic of the projection optical system, such as magnification or image distortion, is required to be measured and regulated at the time of the manufacture by a projection exposure apparatus. The image formation characteristic also is required to be corrected at the time of actual use, because it varies due to an atmospheric pressure variation and illumination light absorption of a projection optical system. As a countermeasure, a method, where a quantity of the variation of the image formation characteristics are predicted in advance and correction of magnification is performed by varying an air pressure of the projection optical system, is known as disclosed, for example, in Japanese Patent Laid-Open Publication Nos. 60-28613 or Sho 60-78457.

However, this method alone is insufficient and also there is the possibility that magnification and image distortion vary due to long-term fluctuations in a system. Therefore, the system should be used while periodically checking magnification and image distortion by means of methods such as described above. Also, since the demand for accuracy of correction corresponding to an atmospheric pressure variation has become increasingly severe in recent years, it is necessary to frequently check a correction error caused by measurement. In this sense, the aforementioned second method whose measurement time is short is superior to the first method, and in many cases, the second method is actually used.

Also, a step-and-scan projection exposure apparatus, where a mask and each shot area of a photosensitive substrate are scanned in synchronization with respect to a projection optical system in order to substantially increase an exposure area without greatly increasing the size of the projection optical system, has been aimed at in recent years. However, there has been provided no method for measuring an image formation characteristic, which makes use of, in particular, the feature of a projection exposure apparatus of a scan exposure type such as a step-and-scan type.

Thus, all of the aforementioned conventional methods of measuring the magnification or image distortion of the projection optical system are a method of measuring a gap or distance between the projected images of two (or more) different marks on a test mask. For this reason, it is necessary to accurately grasp the mark gap or pitch of the test mask in advance. However, normally the patterns on the mask are fabricated with an electronic beam drawing device, and the gap or pitch between spaced marks for measurement of magnification is not very accurate, so the gap of each mask has to be measured in advance with a reticle pattern measuring machine. This measurement is substantially impossible in a manufacturing site where a plurality of masks are used. For this reason, it is conceivable to use a reference mask, but this method has the disadvantage that measurement cannot be performed frequently during the aforementioned actual exposure.

Also, the above method has a problem regarding accuracy of reticle pattern measurement. For example, when a mask is mounted in an exposure apparatus, it is normally disposed with the pattern thereof facing downwardly, but in the reticle pattern measuring machine the mask is mounted with the pattern surface thereof facing upwardly. Therefore, influences of deflection caused by self-weight are different between the two masks. This difference results in a measurement error. In addition, even in the exposure apparatus, deflection by self-weight varies between the masks and causes image distortion.

Furthermore, although it is also conceivable that only some of the masks are measured in order to perform correction of the projection optical system, the gap or distance between the marks varies because the mask absorbs the heat of the illumination light during measurement and therefore the mask itself is thermally expanded. If correction, including the thermal expansion of the mask, is made during measurement, there will be no problem. However, if the mask is exchanged for a subsequent mask, there will be the drawback that an error remains in the magnification of the projection optical system, because the mask after exchange has not been thermally expanded. Moreover, even in a method where the distance between the marks is unknown but magnification is always held in an initial magnification obtained at the time of exchange, if a mask is exchanged for a subsequent one, an error will occur in the magnification of the projection optical system, for the same reasons.

SUMMARY OF THE INVENTION

A primary object of the present invention is to provide an inspection method which is capable of accurately measuring an image formation characteristic of a projection optical system, such as magnification and image distortion, while overcoming drawbacks of conventional inspection methods such as described above.

Another object of the present invention is to provide an inspection method which could be capable of accurately measuring an image formation characteristic of a projection optical system, such as magnification and image distortion, even if there are drawing errors in marks for projection magnification and image distortion measurement formed on a mask.

Still another object of the present invention is to provide an improved inspection apparatus which is capable of accurately and quickly measuring an image formation characteristic of a projection optical system, such as magnification and image distortion.

A further object of the present invention is to provide a projection exposure apparatus having an inspection apparatus which is capable of accurately and quickly inspecting an image formation characteristic of a projection optical system, such as magnification and image distortion.

A further object of the present invention is to provide a projection exposure apparatus which is capable of accurately and quickly measuring an image formation characteristic of a projection optical system, such as magnification and image distortion, and also accurately correcting the image formation characteristic.

A first inspection method for a projection optical system according to the present invention comprises the steps of (1) moving a predetermined pattern formed on a mask to a first position, (2) moving the predetermined pattern to a second position different from the first position perpendicularly with respect to an optical axis of the projection optical system, (3) detecting a positional relationship between the first position and the second position, (4) detecting a positional relationship between a position where the image of the predetermined pattern in the first position is projected by the projection optical system and a position where the image of the predetermined pattern in the second position is projected by the projection optical system, and (5) obtaining an image formation characteristic of the projection optical system, based on the positional relationship detected in step (3) and the positional relationship detected in step (4).

A second inspection method for a projection optical system according to the present invention comprises the steps of (1) detecting a positional relationship between first and second patterns formed on a mask, (2) detecting a positional relationship between a position where an image of the first pattern is projected by the projection optical system and a position where the image of the second pattern is projected by the projection optical system, and (3) obtaining an image formation characteristic of the projection optical system, based on the positional relationship detected in step (1) and the positional relationship detected in step (2).

In the aforementioned first or second inspection method of a projection optical system according to the present invention, an example of the projection optical system is provided in a projection exposure apparatus which transfers the pattern formed on the mask to a photosensitive substrate.

A third inspection method for a projection optical system according to the present invention comprises the steps of (1) detecting a positional relationship between a plurality of reference marks, the reference marks being defined by a reference mark member disposed on a mask stage and also being arranged at intervals in a moving direction of the mask stage, (2) forming projected images of the reference marks on a wafer stage by illuminating a collimated light beam to the reference marks of the reference mark member, (3) moving the wafer stage and then detecting a positional relationship between a plurality of projected images of the reference marks, and (4) obtaining an image formation characteristic of the projection optical system, based on the positional relationship between reference marks and the positional relationship between projected images detected in step (3).

In the aforementioned inspection method, the reference mark member may be a single reference mark member, and the plurality of reference marks may be formed in the single reference mark member. Also, a center of the single reference mark member may be aligned with an optical axis of the projection optical system. In addition, the reference mark member may comprise a plurality of reference mark members, and the plurality of reference mark members may be provided around a position where the mask is arranged.

A fourth inspection method for a projection optical system according to the present invention comprises the steps of (1) detecting a positional relationship between a plurality of reference marks of a reference mark member provided in positions which are optically conjugate with patterns of a mark arranged on a mask stage, the reference marks being arranged at intervals in a moving direction of the mask stage, (2) forming projected images of the reference marks on a wafer stage by illuminating a collimated light beam to the reference marks of the reference mark member, (3) moving the wafer stage and then detecting a positional relationship between a plurality of projected images of the reference marks, and (4) obtaining an image formation characteristic of the projection optical system, based on the positional relationship between reference marks and the positional relationship between projected images detected in step (3).

A first inspection apparatus for a projection optical system according to the present invention comprises: a mask stage arranged on the incident light side of the projection optical system to be inspected and movable in a direction perpendicular to an optical axis of the projection optical system, while holding a mask; a position measuring device for measuring first and second positions of the mask stage; and an image position detection device for detecting a relationship between a projected position at which an image of a predetermined pattern formed on the mask is projected through the projection optical system when the mask stage is in the first position and a projected position at which an image of the predetermined pattern formed on the mask is projected through the projection optical system when the mask stage is in the second position.

A second inspection apparatus for a projection optical system according to the present invention comprises: a mask stage arranged on the incident light side of the projection optical system to be inspected and holding a mask having first and second patterns; a pattern position detection device for detecting a positional relationship between the first and second patterns; and an image position detection device for detecting a relationship between a projected position at which an image of the first pattern is projected through the projection optical system and a projected position at which an image of the second pattern is projected through the projection optical system.

A third inspection apparatus for a projection optical system according to the present invention comprises: a reference mark member provided on a position on a mask stage or a position which is optically conjugate with patterns held in the mask stage and formed with a plurality of reference marks; an illumination optical system for projecting images of the plurality of reference marks toward the projection optical system to be inspected; and an image position detection device for detecting a position of a projected image of at least one of the plurality of reference marks obtained through the projection optical system.

A fourth inspection apparatus of a projection optical system according to the present invention comprises: a reference mark member having a plurality of reference marks formed thereon and disposed on a mask stage adjacent to a mask in a scanning direction of the mask stage; an illumination optical system for projecting images of the plurality of reference marks toward the projection optical system to be inspected; and an image position detection device for detecting a position of a projected image of at least one of the plurality of reference marks obtained through the projection optical system.

A first projection exposure apparatus according to the present invention comprises: a projection optical system for projecting an image of a pattern formed on a mask on a predetermined plane; a mask stage freely movable in a direction perpendicular to an optical axis of the projection optical system, while holding the mask; a position measuring device for measuring a position of the mask stage; a stage control device for moving the mask stage from a first position to a second position, based on an output of the position measuring device; an image position detection device for detecting a positional relationship between a projected position at which an image of the predetermined pattern formed on the mask is projected through the projection optical system when the mask stage is in the first position and a projected position at which an image of the predetermined pattern formed on the mask is projected through the projection optical system when the mask stage is in the second position; and a calculation device for calculating an image formation characteristic of the projection optical system, based on the positions of the mask stage measured by the position measuring device when the mask stage is in the first and second position and based on the positional relationship detected by the image position detection device.

A second projection exposure apparatus according to the present invention comprises: a mask stage for holding a mask having first and second patterns formed thereon; a projection optical system for projecting images of the patterns on a mask onto a predetermined plane; a pattern position detection device for measuring a positional relationship between the first and second patterns; an image position detection device for detecting a positional relationship between a projected position at which an image of the first pattern is projected through the projection optical system and a projected position of an image at which the second pattern is projected through the projection optical system; and a calculation device for calculating an image formation characteristic of the projection optical system, based on the positional relationship detected by the pattern position detection device and the positional relationship detected by the image position detection device.

In the aforementioned projection exposure apparatuses according to the present invention, an example of the pattern position detection device has a pattern detection device for photoelectrically detecting the first and second patterns of the mask, a stage control device for moving the mask stage perpendicularly relative to an optical axis of the projection optical system so that the first and second patterns cross an area of detection of the pattern detection device, and a position measuring device for measuring a position of the mask stage.

Also, the aforementioned first and second projection exposure apparatuses of the present invention further comprise a substrate stage for mounting a photosensitive substrate to which a predetermined pattern of the mask is transferred. In addition, an example of an object to be detected by the image position detection device is an image of the predetermined pattern or first and second patterns transferred to the photosensitive substrate.

Furthermore, it is preferable that the aforementioned first and second projection exposure apparatuses of the present invention are a projection exposure apparatus of the scan exposure type where a photosensitive substrate is exposed while scanning the photosensitive substrate and a mask in synchronization with each other.

A third projection exposure apparatus according to the present invention is suitable for projecting a pattern on a mask mounted on a mask stage onto a photosensitive substrate through a projection optical system and comprises: a reference mark member formed with a plurality of reference marks and disposed in a position on the mask stage or a position which is nearly optically conjugate with the pattern; an image position detection device for detecting a position of a projected image of at least one of the plurality of reference marks under illumination light in the same wavelength band as illumination light for exposure; a calculation device for obtaining an image formation characteristic of the projection optical system, based on the result of the detection of the image position detection device; and a correction device for correcting an image formation characteristic of the projection optical system, based on the image formation characteristic obtained by the calculation device.

A fourth projection exposure apparatus according to the present invention is suitable for projecting a transfer pattern formed on a mask onto a photosensitive substrate through a projection optical system by scanning the photosensitive substrate in a direction (−X direction or +X direction) corresponding to a predetermined scanning direction (+X direction or −X direction) in synchronization as the mask formed with a pattern to be transferred is scanned in the predetermined scanning direction through the mask stage and comprises: a reference mark member having a plurality of reference marks formed thereon and disposed on a mask stage adjacent to a mask in a scanning direction of the mask stage; an image position detection device for detecting a position of a projected image of at least one of the plurality of reference marks under illumination light in the same wavelength band as illumination light for exposure; a calculation device for obtaining an image formation characteristic of the projection optical system, based on the result of the detection of the image position detection device; and a correction device for correcting an image formation characteristic of the projection optical system, based on the image formation characteristic obtained by the calculation device.

In the aforementioned projection exposure apparatus according to the present invention, it is preferable that the reference mark member be arranged within an approach run section of the mask stage where the illumination light for exposure is illuminated, at the time of acceleration or deceleration during scan and exposure.

Also, in the aforementioned third and fourth projection exposure systems according to the present invention, an example of an object of detection of the image position detection device is an image projected on a test photosensitive substrate or a test thermosensitive substrate through the projection optical system.

In accordance with the aforementioned first inspection method of the present invention, the image formation characteristics of the projection optical system, such as magnification and image distortion, could be accurately detected even if there is a drawing error in the mask on the mask for measuring a projection magnification or an image distortion.

That is, the principles of measuring the projection magnification or the image distortion of the projection optical system is to measure how a given length on the mask side varies through the projection optical system. Therefore, it is necessary that a length which becomes single reference on the mask side is accurately known. In the first inspection method of the present invention, a predetermined pattern on the mask is moved. To obtain the positional relationship (distance of movement), a distance that this pattern is moved becomes a single strict length standard on the mask side. And, to obtain the positional relationship between the images of this predetermined pattern obtained on a predetermined plane through the projection optical system before and after the movement of the predetermined pattern, the relation between a length which becomes a single standard on the mask side and a variation in the length through the projection optical system, i.e., the image formation characteristics of the projection optical system is strictly obtained.

Also, in accordance with the aforementioned second inspection method for the projection optical system of the present invention, a length which becomes a single standard on the mask side is strictly known by obtaining the positional relationship (gap) between the first and second patterns formed on the mask. This method, as with the aforementioned first inspection method of the present invention, could accurately detect the image formation characteristics of the projection optical system, such as magnification and image distortion, even if there is a drawing error in the mark on the mask for measuring projection magnification or an image distortion.

In addition, in the first and second inspection methods for the projection optical system of the present invention, in a case where the projection optical system is provided in a projection exposure apparatus where a pattern formed on a mask is transferred onto a photosensitive substrate, the image formation characteristics of the projection optical system can be accurately detected. If correction is performed based on the detection, the mask pattern can be transferred with a high degree of overlap or registration accuracy to the photosensitive substrate.

Furthermore, according to the first projection exposure apparatus of the present invention, the aforementioned first inspection method for the projection optical system can be carried out. That is, accurate measurement of magnification and image distortion can be performed with respect to not only a test mask where a gap or distance between marks is measured in advance but also all masks that are used in actual exposure.

Moreover, according to the fourth projection exposure apparatus of the present invention, the aforementioned second inspection method for the projection optical system can be carried out. That is, the positional relationship between the first and second patterns formed on the mask is accurately detected as needed by means of the pattern position detection device. Therefore, the second projection exposure apparatus of the present invention, as with the first projection exposure apparatus of the present invention, could accurately detect the image formation characteristics of the projection optical system even if masks were different.

In the aforementioned second projection exposure apparatus of the present invention, the pattern position detection device has a pattern detection device for photoelectrically detecting the patterns on the mask, a stage control device for moving the mask stage perpendicularly relative to an optical axis of the projection optical system so that the first and second patterns cross an area of detection of the pattern detection device, and a position measuring device for measuring a position of the mask stage. In such a case, the mask stage is moved by the stage control device, and the first and second patterns on the mask are detected by the pattern detection device. At this time, the position of the mask stage is detected by the position measuring device. In this way, the positional relationship between the first and second patterns can be detected.

Also, in the third and fourth projection exposure apparatuses of the present invention, when the apparatuses further comprise a substrate stage for mounting a photosensitive substrate to which a pattern of the mask is transferred and also an object to be detected by the image position detection device is an image of the predetermined pattern or first and second patterns transferred to the photosensitive substrate, the image formation characteristics of the projection optical system can be accurately detected in the same state as actual exposure.

In addition, when the third and fourth projection exposure apparatuses of the present invention are a projection exposure apparatus of the scan exposure type where a photosensitive substrate is exposed while scanning the photosensitive substrate and a mask in synchronization with each other, the apparatus do not need to be newly modified because normally there is provided a mask stage and a position measuring device which are the constitutional elements of the present invention.

Furthermore, according to the third projection exposure apparatus, the image formation characteristics of the projection optical system is accurately measured without suffering the influence of a drawing error on the mask and is corrected by the correction device.

In the prior art, the image formation characteristics, such as magnification or image distortion, has been measured with the reference mark for measurement of the mask. On the other hand, in the present invention, the reference mark member has a plurality of reference marks whose positions are accurately measured in advance, and when the image formation characteristics of the projection optical system is measured, the reference mark member is moved, for example, up to a position where the mask is held during exposure, and the image formation characteristic, such as projection magnification or image distortion, is measured with the reference marks of the reference mark member. Therefore, unlike the prior art, the image formation characteristics of the projection optical system can be measured and accurately corrected without suffering the influence of a drawing error of the reference mark for measurement on the mask, a picture position measurement error, or thermal expansion of the mask.

According to the fourth projection exposure apparatus of the present invention, in the scan-exposure type projection exposure apparatus, as with the first projection exposure system, the image formation characteristics of the projection optical system can be measured without suffering the influence of a drawing error on the mask and can be corrected by the correction device. Also, since the reference mark member has been arranged on the mask stage in the scanning direction with respect to the mask, the reference mark member can be quickly arranged in a position where the mask is exposed, by moving the mask stage.

In addition, in the fourth projection exposure apparatus of the present invention, when the reference mark member is arranged within an approach run section of the mask stage where the illumination light for exposure is illuminated, at the time of acceleration or deceleration during scan and exposure, there is no need to provide an additional place for the reference mark member. Since the reference mark member is arranged within the approach run section during scan and exposure, illumination light for exposure can be used as illumination light for illuminating the reference mark. Therefore, a measurement error of the image formation characteristics, which is caused due to a difference between illumination light beams, does not occur.

Furthermore, in the aforementioned third and fourth projection exposure systems of the present invention, when an object to be detected by the image position detection device is an image projected on a test photosensitive substrate or a test thermosensitive substrate through the projection optical system, the image formation characteristics of the projection optical system can be accurately detected in the same state as actual exposure.

BRIEF DESCRIPTION OF THE DRAWINGS

The present invention will be described in further detail with reference to the accompanying drawings, in which:

FIGS. 6(a) and 6(b) are diagrams showing a modification of the pattern plate used in the exposure system of FIG. 3, and FIGS. 6(c) and 6(d) are graphs showing the output waveform and the differentiated value of a photoelectric sensor obtained when the pattern plate of FIGS. 6(a) and 6(b) is used;

FIG. 7(a) is a schematic view showing the essential section of a projection exposure apparatus for explaining a second embodiment of the inspection method for the projection optical system according to the present invention, and FIG. 7(b) is a diagram showing a resist image formed by exposure in the second embodiment;

FIG. 8 is a flowchart showing a third embodiment of the inspection method for the projection optical system according to the present invention;

DETAILED DESCRIPTION OF THE PREFERRED EMBODIMENTS

A first embodiment of an inspection method for a projection optical system according to the present invention and a projection exposure apparatus for carrying out the inspection method will hereinafter be described in reference to FIG. 2 and FIGS. 4(a) to 4(d). The embodiment of the present invention is applied to a step-and-scan projection exposure apparatus where patterns on a reticle (photomask) are serially transferred on shot areas of a semiconductor wafer (photosensitive substrate) while scanning the reticle and the wafer in synchronization with each other.

Figure 3:
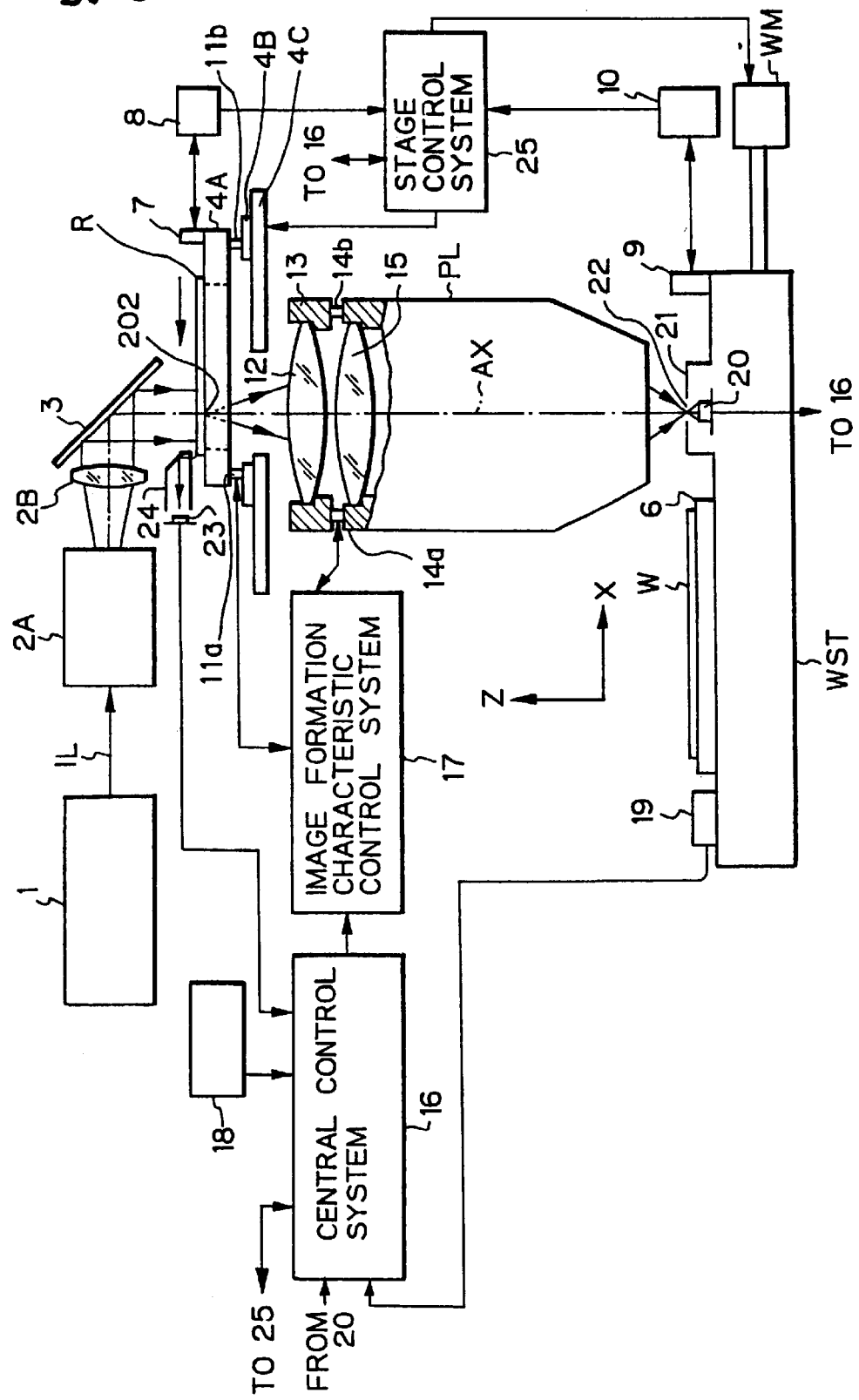
FIG. 3 is a schematic view, partly in section, showing a projection exposure apparatus for carrying out the inspection method for the projection optical system of FIG. 2.

FIG. 3 schematically illustrates the projection exposure apparatus of this embodiment. In the figure, reference character IL denotes illumination light (e.g., bright-line such as a g-line or an i-line in a ultraviolet spectral region) emitted from a light source 1 comprising an extra-high pressure mercury vapor lamp. The illumination light IL passes through a shutter (not shown) and is converted to luminous flux whose illuminance distribution is substantially uniform by means of an illuminance uniforming illumination system 2A comprising a collimator lens, a fly-eye lens, and a reticle blind. In addition to the bright-line of the extra-high pressure mercury-vapor lamp, a KrF excimer laser beam, an ArF excimer laser beam, copper vapor laser beam or harmonics of YAG laser beam is employed as illumination light IL. Also, the reticle blind comprises a plurality of movable light shielding portions so that an area on a reticle R which is illuminated can be optionally set.

The illuminance uniforming illumination system 2A is further provided with a variable diaphragm for varying an illumination state of the reticle R. With this variable diaphragm, the numerical aperture (σ-value which is a coherence factor of the illumination system) of the aperture diaphragm of the illumination system 2A is varied, or optimum illumination conditions are selected according to the pattern (linewidth, pitch, periodical pattern, isolated pattern) of an object of exposure by ring-shaped illumination.

The illumination light IL emitted from the illuminance uniforming illumination system 2A passes through a condenser lens 2B and is bent vertically downward by a mirror 3 so that patterns (e.g., integrated circuit patterns) on the reticle R are illuminated and projected onto a semiconductor wafer W through a projection optical system PL. In FIG. 3, it is assumed that Z axis is parallel to the optical axis AX of the projection optical system PL, Y axis is perpendicular to the surface of FIG. 3 in the plane perpendicular to the Z axis, and X axis is parallel to the surface of FIG. 3.

The reticle R is held on a reticle stage 4A by vacuum suction. The reticle stage 4A slightly moves in a two-dimensional plane (XY plane) perpendicular to the optical axis AX of the projection optical system PL to position reticle R. The reticle stage 4A is attached to slide members 4B through at least two drive elements such as piezoelements capable of expansion and contraction in the Z direction (in FIG. 3 only two drive elements 11a and 11b are shown). The slide members 4B are freely slidably mounted on a reticle base 4C of a main body (frame) of the projection exposure apparatus so that they can freely slide in the X direction. Since the projection optical system PL is also fixed to the main body (not shown), a gap between the projection optical system PL and the reticle R can be varied by the drive elements 11a and 11b. These drive elements 11a and 11b are controlled by an image formation characteristic control system 17.

The reticle stage 4A (slide member 4B) is moved on the reticle base 4C at a specified scanning speed in ±X directions (scanning directions) by a reticle drive system (not shown) constituted by a linear motor. The reticle stage 4A has a moving stroke whereby the entire surface of the reticle R can cross at least the optical axis AX of the projection optical system PL. To the end portion of the reticle stage 4A, a movable mirror 7 for reflecting a laser beam emitted from an externally provided laser interferometer 8 is fixed so that the position of the reticle stage 4A in the scanning direction can be detected at all times with resolution of, for example, the order of 0.01 μm by the laser interferometer 8. The measured value by the laser interferometer 8 is sent to a stage control system 25. Based on the information on the measured value, the stage control system 25 controls the reticle drive system for the reticle stage 4A. The information on the measured value is also supplied to a central control system 16 from the stage control system 25. The central control system 16 controls the stage control system 25, based on the information on the measured value.

A reticle alignment microscope 24 for forming an image of a predetermined mark (not shown) formed on the reticle R and a light-receiving sensor 23 for detecting an image of the predetermined mark are arranged at predetermined positions above the reticle stage 4A. With this reticle alignment microscope 24, the initial position of the reticle stage 4A is determined to a predetermined reference position with high accuracy, and consequently, the position of the reticle R can be measured with sufficiently high accuracy measured only by measuring the position of the movable mirror 7 by the laser interferometer 8.

Figure 4A:
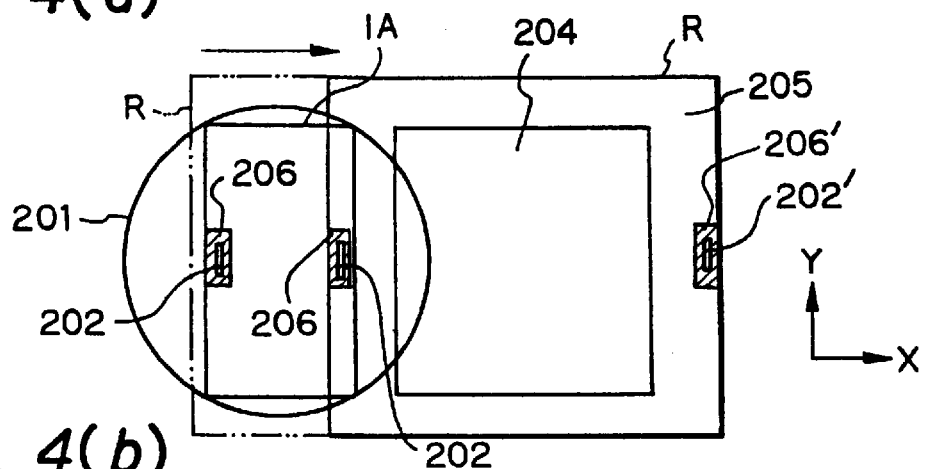
FIGS. 4(a) to 4(d) are diagrams used to concretely explain the inspection method for the projection optical system of FIG. 2, FIG. 4(a) being a plan view showing a reference mark formed on the reticle, FIG. 4(b) being an elevational view showing the essential section of the exposure system of FIG. 2, FIG. 4(c) being a plan view of a pattern plate used in the constitution of FIG. 4(b), and FIG. 4(d) being a graph showing an output curve of a photoelectric sensor.

Now, the structure of the reticle R will be briefly described in reference to FIG. 4(a). FIG. 4(a) is an enlarged plan view of the reticle R shown in FIG. 2 and illustrates the state where the reticle R has been moved from a position indicated by a phantom line to a position indicated by a solid line. In this embodiment, small rectangular light shielding portions 206 and 206' are provided in the opposite ends of a region 205 in the scanning direction (X direction). The region 205 surrounds the periphery of a circuit pattern 204 formed in the central portion of the reticle R. Reference marks 202 and 202' comprising long slit-shaped light transmitting portions extending in the direction (Y direction) perpendicular to the scanning direction are formed in the light shielding portions 206 and 206', respectively. The image formation characteristics of the projection optical system PL can be measured by moving the reticle R from a first reference position indicated by the phantom line to a second position indicated by the solid line by means of the reticle drive system and then precisely measuring the distance of movement of the reticle R between the two reference positions and, for example, the distance of movement of a projected image of the reference mark 202 on the wafer W. In this case, the first reference position is a position where the reference mark 202 comes to the left side (−X direction) end of a long illumination region area IA in an effective field 201 of the reticle side of the projection optical system PL, and the second reference position is a position where the reference mark comes to the right side (+X direction) end of the illumination area IA.

Returning to FIG. 3, the illumination light IL having passed through the reticle R enters into the double-sided telecentric projection optical system PL. Then, the circuit pattern 204 of the reticle R is reduced at projection magnification β by the projection optical system PL, and the circuit pattern 204 is transferred to a thin layer of photosensitive material (called photoresist) applied on the surface of the wafer W. The projection optical system PL of this embodiment is provided with a mechanism for correcting the image formation characteristics, and this correction mechanism will be described in detail later.

When the aforementioned circuit pattern 204 of the reticle R is reduced at projection magnification β and transferred to the surface of the wafer W by a scanning exposure method, the wafer W is scanned at a fixed speed $V_W$ (=β·$V_R$) in the +X direction (or −X direction) in synchronization as the reticle R is scanned at the fixed speed in the −X direction (or +X direction) with respect to the slit-shaped illumination area IA by the illumination light IL. The width of the illumination area IA in longitudinal direction (Y direction) is set wider than the circuit pattern 204 of the reticle R so that the entire surface of the circuit pattern 204 is illuminated by scanning the reticle R and the wafer W.

The wafer W is held on a wafer holder 6 by vacuum suction, and the wafer holder 6 is mounted on a wafer stage WST. The wafer holder 6 is tiltable in any direction with respect to an optimum image plane of the projection optical system by means of a bottom drive unit (not shown) and slightly movable in the direction (Z direction) along the optical axis AX. The wafer holder is also rotatable about the optical axis AX by means of a rotary table in the bottom. On the other hand, the wafer stage WST is movable not only in the aforementioned scanning direction (X direction) but also in the direction (Y direction) perpendicular to the scanning direction so that it can move to any desired shot area in a plurality of shot areas at any time. The wafer stage WST performs a step-and-scan operation where an operation scanning and exposing a shot area of the wafer W and an operation moving up to an exposure starting position of the next shot area are repeated. The wafer stage WST is driven in the X and Y directions by means of a wafer stage drive system WM, such as a motor. To the end portion of the upper surface of the wafer stage WST, a movable mirror 9 for reflecting a laser beam emitted from an externally provided laser interferometer 10 is fixed so that the position on the X-Y plane of the wafer stage WST can be detected at all times with resolution of, for example, the order of 0.01 μm by the laser interferometer 10. The positional information (or velocity information) of the wafer stage WST is sent to the stage control system 25. The stage control system 25 controls the operation of the wafer stage drive system WM, based on the positional information (or velocity information). The positional information (or velocity information) of the wafer stage SWT detected by the laser interferometer 10 is also supplied to the central control system 16 through the stage control system 25. Based on this information, the central control system 16 controls the stage control system 25.

The exposure apparatus shown in FIG. 3 is further provided with a focus position detecting system (not shown) of an oblique incidence type. The focus position detecting system comprises a light-emitting system and a light-receiving system. The light-emitting system obliquely supplies an image forming light beam for forming a pinhole image or a slit image onto the exposure surface of the wafer W with respect to the optical axis AX, while the light-receiving system receives a reflected light beam of the image forming light beam reflected at the exposure surface of the wafer W through a slit. The positional information of the wafer W in the Z-direction from the focus position detecting system is supplied to the central control system 16. The central control system 16 controls the wafer stage WST so that the Z direction position and the tilt angle of the wafer W correspond to those of the image forming surface of the projection optical system PL.

Now, a photoelectric detection system which is a mark detector on the wafer stage WST, will be explained in reference to FIG. 3 and FIGS. 4(a) to 4(d). The photoelectric detection system used herein is disclosed, for example, in Japanese Patent Laid-Open Publication No. Sho 59-94032, and photoelectrically detects the pattern on the reticle R through the projection optical system PL. Although there is a correction method of calculating a change in the image formation characteristics, the aforementioned photoelectric detection system is used in a method of directly observing a space image of the projection optical system PL to obtain the image formation characteristics.

In FIG. 3, a pattern plate 21 is fixed on the wafer stage WST such that the upper surface thereof is in substantially the same level as the upper surface of the wafer W and is provided with a slit-shaped light transmission portion 22 extending in the Y direction.

Figure 4B:
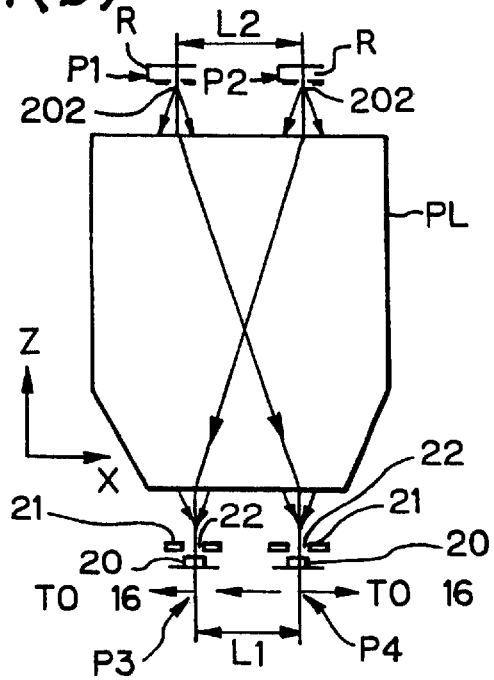
Figure 4C:
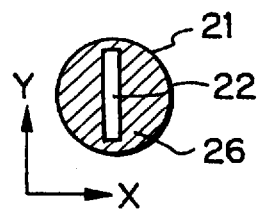

FIG. 4(c) is a plan view of the pattern plate 21. The light transmission portion 22 surrounded by the light shielding portion 26 of the pattern plate 21 has substantially the same size as a projected image of the reference mark 202 or 202' of the reticle R projected onto the pattern plate 21. A photoelectric sensor 20 such as a silicon photodiode is provided under the light transmission portion 22, as shown in FIG. 3, and the projected image of the reference mark 202 or 202' detected the projection optical system PL is sensed by the photoelectric sensor 20. Information as to the projected image of the reference mark 202 or 202' detected by the photoelectric sensor 20 is supplied to the central control system 16.

Now, the correction mechanism of the image formation characteristic of the projection optical system PL will be described in detail in reference to FIG. 3. This correction mechanism corrects a variation in the image formation characteristic of the projection optical system PL itself, which variation being caused by a variation in the atmospheric pressure, illumination light absorption, and a change in illumination conditions. The correction mechanism also has a function of distorting the projected image of the reticle R in correspondence with a distortion of the previous exposure shot area on the wafer W. A description of the correction mechanism will hereinafter be made.

As shown in FIG. 3, in this embodiment the correction of the image formation characteristics is performed by driving the reticle stage 4A having the reticle R mounted thereon or a lens element 12 of the projection optical system PL by means of the image formation characteristic control system 17. In the projection optical system PL, the lens element 12 nearest to the reticle R is fixed to a support member 13. A lens element 15 following the lens element 12 and subsequent elements after the lens element 15 are fixed to a lens barrel of the projection optical system PL. In this embodiment, the optical axis AX of the projection optical system PL represents an optical axis of the optical system (lens element 15 and subsequent elements) of the main body of the projection optical system PL. The support member 13 is connected to the lens barrel of the projection optical system through drive elements comprising at least two piezoelements capable of expansion and contraction (in FIG. 3 only two drive elements 14a and 14b are shown).

The lens element 12 can be moved parallel to the optical axis AX and also tilted with respect to the plane perpendicular to the optical axis AX by the expansion and contraction of the drive elements 14a and 14b so that the image formation characteristics of the projection optical system PL, for example, projection magnification, distortion, curvature of field, and astigmatism can be corrected. Likewise, the image formation characteristics control system 17 moves or tilts the reticle R by the expansion and contraction of the drive elements 11a and 11b to correct the image formation characteristics. A photoelectric sensor 19 is fixedly mounted on the wafer stage WST for measuring a quantity of the illumination light which passes through the projection optical system PL. An environmental sensor 18 is arranged in the vicinity of the projection optical system PL for sensing atmospheric pressure. The outputs of the photoelectric sensor 19 and the environmental sensor 18 are supplied to the central control system 16. Based on these outputs, the central control system 16 calculates a quantity of variation in the image formation characteristics, as will be described later.

Now, an example of the inspection operation of the projection optical system of this embodiment will be described in reference to FIG. 2. In this example there is shown a method of measuring the magnification of the projection optical system PL in the scanning direction (X direction) by using the reference mark 202 of the reticle R alone.

Figure 1A:
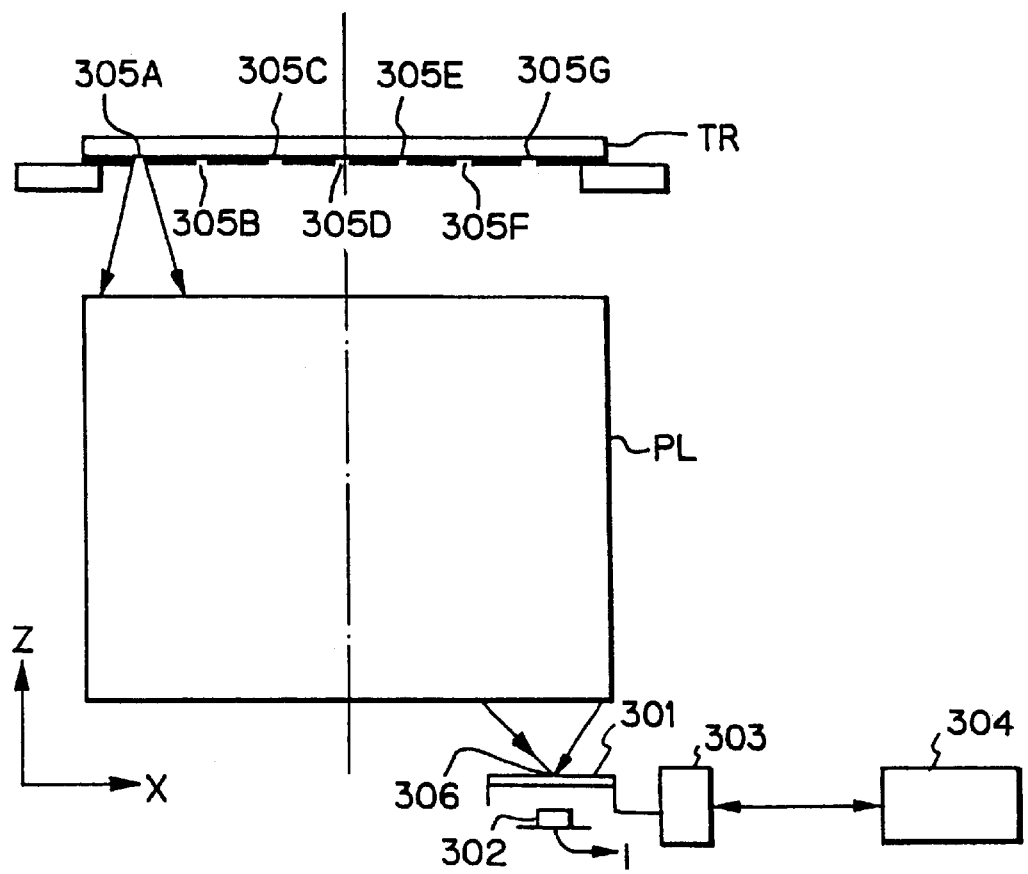
FIGS. 1(a) and 1(b) are diagrams of a conventional inspection method for a projection optical system, FIG. 1(a) showing the schematic structure of the system and FIG. 1(b) showing an output curve of a photoelectric sensor.
Figure 1B:
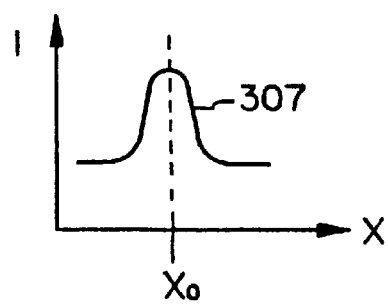
Figure 2:
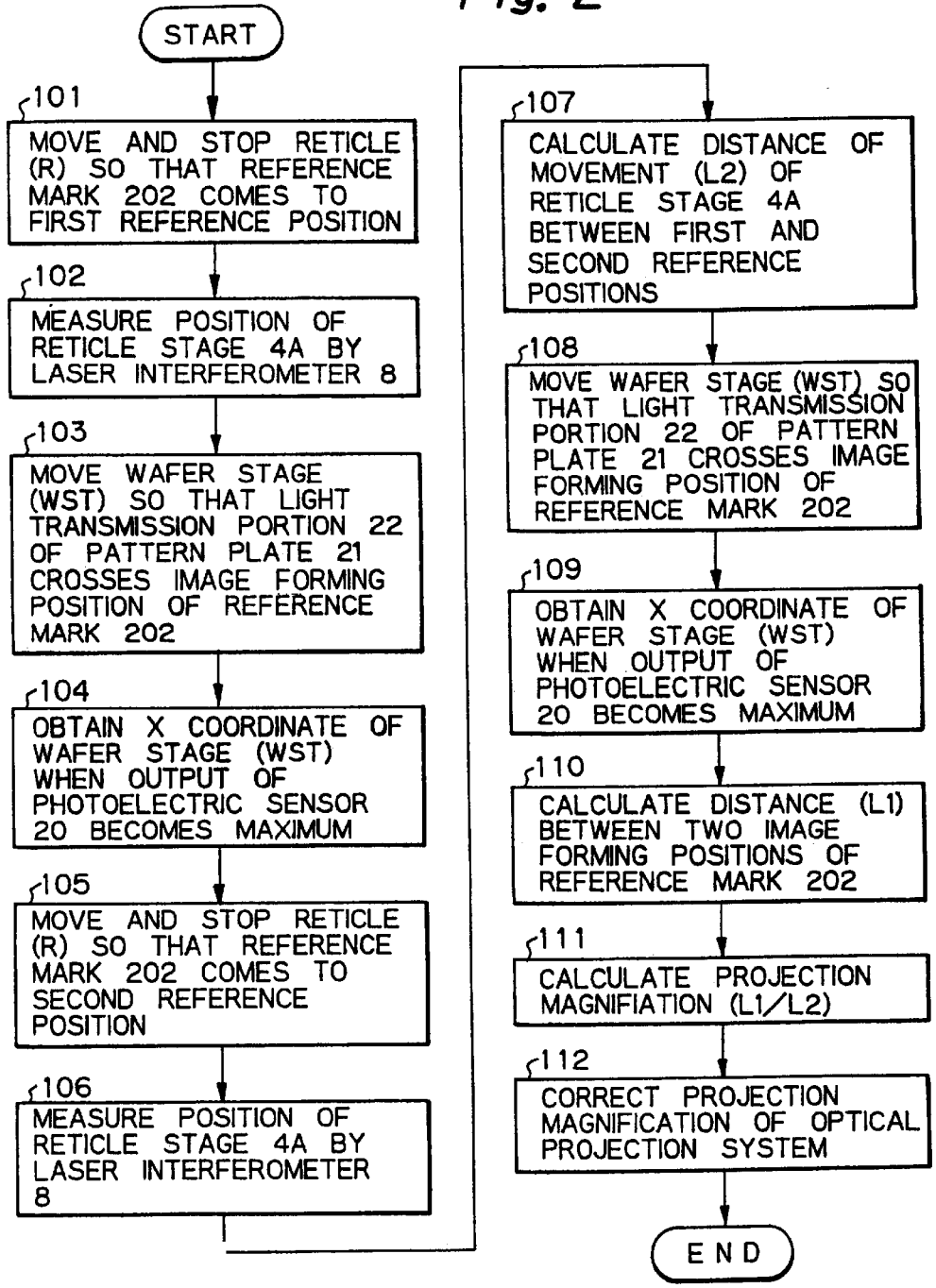
FIG. 2 is a flowchart showing a first embodiment of an inspection method for a projection optical system according to the present invention.

FIG. 2 shows a flowchart of the inspection operation of this embodiment. Initially, in step 101, as shown in FIG. 4(a), illumination light for exposure is illuminated on the illumination area IA, and the reticle R is moved and stopped at the left side (-X direction) position of the illumination area IA indicated by the phantom line so that the reference mark 202 on the reticle R comes to the first reference position. In step 102 the position of the reticle stage 4A is measured by the laser interferometer 8 on the reticle R side. In step 103 the wafer stage WST is moved so that the light transmission portion 22 of the pattern plate 21 on the wafer stage WST can cross a roughly estimated position P4 of the projected image of the reference mark 202 obtained through the projection optical system PL, and then the X coordinates where the output of the photoelectric sensor reaches its peak are obtained.

FIG. 4(b) shows the relationship, through the projection optical system PL, between the reticle R and the photoelectric detection system on the wafer stage WST. When the reticle R is in the left side first reference position P1, the wafer stage WST is moved in the X direction in the vicinity of the right side position P4, and the image of the reference mark 202 on the reticle R through the projection optical system PL is sensed with the photoelectric sensor 20.

Figure 4D:
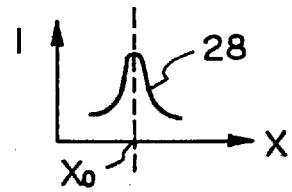

FIG. 4(d) shows a graph representing the relationship between the position of the wafer stage WST and the quantity of the light received by the photoelectric sensor 20. In FIG. 4(d) the axis of abscissa represents a position x of the wafer stage WST and the axis of ordinate represents a light intensity I received at the light-receiving surface of the photoelectric sensor 20. The center $x_0$ of waveform curve 28 of this graph is measured as the center of an image forming position of the reference mark 202. This waveform curve 28 is taken into a storage portion of the central control system 16 in correspondence with X coordinates.

Based on the waveform curve taken in, in step 104 the central control system 16 obtains a position $x_0$ where the output of the photoelectric sensor 20 becomes maximum. The obtained position $x_0$ is an image forming position on the wafer W where the reference mark 202 on the reticle R at the first reference position is formed.

Then, in step 105 the reticle R is moved and stopped at the right side (X direction) position of the illumination area IA so that the reference mark 202 on the reticle R shown in FIG. 4(b) comes to the second reference position P2. In step 106 the position of the reticle stage 4A is measured by the laser interferometer 8 for the reticle stage. The measured value by the laser interferometer 8 is sent to the central control system 16 through the stage control system 25. In step 107 a distance L2 between the second and first reference positions of the reference mark 202 in the X direction is calculated by the central control system 16.

In step 108 the wafer stage WST is moved so that the light transmission portion 22 of the pattern plate 21 on the wafer stage WST can cross a rough image forming position P3 of the projected image of the reference mark 202 obtained through the projection optical system PL. With the same operation as the first reference position of the reticle R, in step 109 the X coordinates of the wafer stage WST where the output of the photoelectric sensor 20 becomes maximum are obtained. The obtained X coordinates are an image forming position on the wafer W where the reference mark 202 of the reticle R at the second reference position is formed.

In step 110 a gap L1 between the image forming positions of the reference mark 202 at the two reference positions is calculated by means of the central control system 16. Then, in step 111, projection magnification is calculated by means of the central control system 16, based on the traveled distance L2 of the reference mark 202 of the reticle R and on the distance L1 between the image forming positions on the wafer W. The projection magnification is obtained from a ratio of the distance L1 between the projected images on the wafer stage WST to the traveled distance L2 of the reference mark 202 of the reticle R, i.e., L1/L2. Note that image distortion in the illumination area IA is obtained by further performing the aforementioned measurement at a plurality of reference positions. Based on the foregoing results, in step 112 the projection magnification of the projection optical system PL is corrected by instruction of the central control system 16.

Note that the same is also true of the reference mark 202'. Also, since this method finds the contrast of an image, a focus position can also be measured by viewing the contrast while varying the position of the optical axis AX direction (Z direction) of the light transmission portion 22. Note that there is also a method which enhances measurement reproducibility by using a plurality of lines instead of the reference mark 202 of this embodiment comprising a single line.

A scan type projection exposure apparatus such as this embodiment is constructed so that the reticle R can move in the lateral direction (X direction) of the illumination area IA, as shown in the embodiment of FIG. 4(a). Therefore, only an X directional component can be measured. However, there is no problem for practical use, because, normally, variations in magnification and image distortion symmetrically occur with respect to the optical axis AX. Of course, if the reticle R can move in the X and Y directions, measurements of the X and Y directions can be made without any problem. Note that, in an exposure apparatus of a one-shot exposure type (e.g., stepper) differing from the scan type, normally the reticle cannot largely move, but the method of this embodiment can be applied by modifying the reticle stage side so that the reticle can move in a predetermined distance.

Incidentally, to increase measurement reproducibility in magnification, the distance L2 of movement of the reticle R can be made longer. However, since the distance L2 is taken along a short side of the illumination area IA, the reference mark 202' will go out of the illumination area IA if the movement distance L2 is made longer, and the reference mark 202' cannot largely move. For this reason, an illumination system for illuminating a very small area used only for magnification measurement may be provided outside the normal illumination area. In such a case, however, the illumination system for magnification measurement cannot deal with a variation in the image formation characteristics caused by a change in the illumination conditions of the original illumination system. But, the above problem can be settled by providing a mechanism for changing illumination conditions for the illumination system for magnification measurement, or by correcting the variation in the image formation characteristic by measuring and storing the variation in advance with the resist image.

Although, in this embodiment, reticle stage 4A remains stationary and the wafer stage WST is slightly moved to measure the image forming position of the reference mark on the reticle R, there may be a method where the reticle stage is driven and the wafer stage remains stationary, because the reference mark on the reticle and the photoelectric detection system may perform a relative scanning. Also, while in this embodiment there has been shown a measuring method using the slit-shaped light transmission portion 22, any method can be used if it is a method of obtaining an image formation characteristic from a space image.

Now, another example of the pattern plate on the wafer stage will be described in reference to FIGS. 6(a) to 6(d). In this example, a scanning operation is performed with a pattern plate whose light transmission portion is not a slit-shaped aperture portion extending in the non-scanning direction but rather an aperture portion extending in the scanning direction, and illumination light is received by a photoelectric sensor 20.

FIGS. 6(a) and 6(b) show the pattern plate of this embodiment. FIG. 6(a) is a sectional view of the pattern plate, and FIG. 6(b) is a plan view of the pattern plate. As shown in FIG. 6(b), the circular pattern plate 402 has a light shielding portion 403 and a light transmission portion 401. The light transmission portion 401 has substantially the same width in the non-scanning direction (Y direction) as the length of the projected image of the reference mark 202 on the reticle R in the non-scanning direction and also has a straight edge 404 at the end of the scanning direction (X direction). As shown in FIG. 6(a), the photoelectric sensor 20 is arranged just under the pattern plate 402 so that it covers the entire surface of the light transmission portion 401, and the sensor 20 senses the projected image of the reference mark 202.

This method is one which utilizes the edge 404 of the light transmission portion 401. If the wafer stage WST is scanned in the X direction using this pattern plate 402, the quantity of light entering into the photoelectric sensor 20 will be measured as an integrated quantity. This will be described in reference to FIGS. 6(c) and (d).

FIG. 6(c) shows the waveform of the output signal from the photoelectric sensor 20, while FIG. 6(d) shows a signal waveform obtained by differentiating the output I from the photoelectric sensor 20 at the position, x, of the wafer stage WST in the X-direction. In FIGS. 6(c) and 6(d), the axis of abscissa represents the position, x, and the axis of ordinate represents the output I. In FIG. 6(c), a curve 405 indicates the output I from the photoelectric sensor 20. As the wafer stage WST moves, the output I shown by the curve 405 gradually increases and reaches a fixed value at a certain position. As the wafer stage WST moves toward the image forming position, a rise angle becomes greater. As the wafer stage WST moves away from the image forming position, the rise angle becomes reduced and converges to 0.

That is, since a signal obtained by integrating a waveform corresponding to the curve 28 shown in FIG. 4(d) is obtained from the photoelectric sensor 20, it is necessary to obtain an output signal corresponds to the curve 28 of FIG. 4(d) by differentiating the signal. Since the curve 406 of FIG. 6(d) is a curve obtained by differentiating the curve 405 of FIG. 6(c) at the position, x, of the wafer stage WST, an output signal corresponding to the curve 28 of FIG. 4(d) has been obtained. Therefore, the image forming position is calculated by a method similar to that described in FIGS. 4(a) to 4(d).

The method of this embodiment is disadvantageous in that the calculation processing becomes complicated, but advantageous in that less quantity of light is required and the pattern plate 402 is easy to form. This method also has the advantage that marks of various linewidths can be measured by a single light transmission portion 401. In addition, there can be used a method where the formed image is enlarged and measured with a photoelectric sensor capable of one-dimensional or two-dimensional measurement, such as CCD.

Now, a description will be made of the correction operation of the image formation characteristics of the projection optical system of the first embodiment. The image formation characteristics of the projection optical system include, for example, focus position, curvature of field, distortion (magnification error, image distortion), and astigmatism. There are various correction mechanisms for correcting the image formation characteristics, but in this embodiment a description with regard to a correction mechanism of distortion will be given.

When in FIG. 3 the lens element 12 is moved in a direction parallel to the optical axis AX, the magnification of the projection optical system PL (magnification of the size of a projected image) varies at a rate of variation corresponding to the distance of movement of the lens element 12. Also, when the lens element 12 is tilted with respect to the plane perpendicular to the optical axis AX, with respect to the axis of rotation one magnification is enlarged and another magnification is reduced. Therefore, distortion where a square is distorted in the form of a trapezoid can be generated, and with this, conversely the distortion can be corrected.

Now a description will be made of a case where the reticle R is driven. The reticle R is mounted on the reticle stage 4A, as described above. Since the reticle stage 4A is mounted on the slide members 4B through a plurality of drive elements 11a and 11b capable of expansion and contraction, the gap or distance between the reticle R and the projection optical system PL can be varied by means of the drive elements 11a and 11b. When the reticle is moved in the direction parallel to the optical axis AX, the projected image may generate a variation called a bobbin type (or barrel type) distortion.

As described above, the projection magnification or image distortion of the projection optical system PL can be optimally corrected by driving the reticle R or the lens element 12. When the reticle R or the lens element 12 is driven, the focus position or the image plane varies. The variation quantity is fed back as an offset value of a focus position detection system (not shown) for the Z direction of the wafer W so that the position of the wafer W matches the focus position or image plane of the projection optical system PL.

A method of correcting the distortion of the projected image is not limited to the aforementioned method. For example, there have been proposed various kinds of methods, such as a method where a glass plate such as for correcting image distortion is inserted into a space between the projection optical system and the reticle R, a method of varying a thickness of the glass plate, or a method where an air space of part of the projection optical system PL is sealed and the composition of the pressure or air is varied. These methods can be likewise used.

The aforementioned correction method, in addition to correcting the measured image formation characteristics, is normally used in correction of variations in the image formation characteristics caused by an environmental variation in atmospheric pressure, illumination light absorption of the projection optical system PL, or a change in illumination conditions. This correction will hereinafter be briefly described.

Initially, a description will be made of the correction corresponding to an environmental variation such as a variation in atmospheric pressure. Data from the environmental sensor 18 comprising an atmospheric pressure sensor and a temperature sensor are supplied to the central control system 16. Based on these data, a quantity of variation in the image formation characteristics is calculated in the central control system 16 from coefficients previously obtained from calculation or experiment, or a table. In addition, a correction quantity of each correction unit of the reticle stage 4A is obtained, and the result is sent to the image formation characteristic control system 17 as a signal. Based on this signal, the image formation characteristic control system 17 drives the lens element 12 and the drive elements 14a, 14b, 11a, and 11b for the reticle stage to make a correction.

For the illumination light absorption of the projection optical system PL, measurement of the quantity of an illumination light passing through the projection optical system PL is performed before actual exposure operation, for example, by means of the photoelectric sensor 19 on the wafer stage WST. The photoelectric sensor 19 has a light-receiving area enough to receive light from the slit-shaped illumination area of the projection optical system PL at a time. At the time of the measurement, the wafer stage WST is stopped when the photoelectric sensor 19 is in the center of the optical axis AX of the projection optical system PL, and the measurement of the quantity of the illumination light is performed at the time of the scanning of the reticle, while scanning the reticle stage 4A alone. The measurement result by the photoelectric sensor 19 is supplied to the central control system 16. In the central control system 16, the variation characteristics of the image formation characteristics for the quantity of an illumination light is stored in advance in the form of a mathematical model such as a differential equation, and a variation in the image formation characteristics is momentarily calculated as the quantity of the illumination light varies. Based on the result of the calculation, a correction similar to the correction for the aforementioned environmental variation is made by instructions of the central control system 16. Furthermore, for the change in illumination conditions, in the central control system 16 a variation in the image formation characteristics is likewise calculated based on a signal from an illumination condition control system (not shown), and a correction is made based on the result of the calculation.

As described above, according to the aforementioned method, measurements of magnification and image distortion are possible with respect to not only a test reticle where a distance between marks is measured in advance but also all reticles which are used in actual exposure. Therefore, exposure can be performed one by one while performing calibration by measurement and the aforementioned image formation characteristics correction device.

Although the conventional exposure apparatus is also provided with a function for calculating and correcting the quantity of variation of the image formation characteristics, there is the possibility that an error will occur due to an unexpected long-term variation in the apparatus, a difference between reticles, a measurement error of the laser interferometer, and a difference between influences of illumination light absorption. Also, there is the problem that the variation characteristic of the image formation characteristics must be precisely obtained as a correction coefficient for each illumination condition, and furthermore, it takes time to regulate the apparatus. However, if, with a reticle which is used in actual exposure, frequent calibration is performed as in this embodiment with respect to the variation calculation, then an accurate correction will be performed, and the correction calculation will be sufficient if interpolation is performed during calibration and will not require high accuracy. For this reason, the method of this embodiment also has the advantage that the regulation of the correction calculation mechanism becomes simple.

However, if measurement is performed very frequently to perform calibration, throughput (reproducibility) will be reduced. For this reason, the calibration is to be performed considering a balance with accuracy. For example, when there are not many factors causing variations, there is no need to perform calibration. Then, a method, where calibration is performed each time the aforementioned variation calculation varies by a fixed value due to illumination light absorption, is considered. According to this method, calibration is performed only when variation is large. There is also a method where calibration is performed only at the leading head of a lot or only when the illumination conditions are changed. Also, there is a method where calibration is performed at intervals of a fixed time or a predetermined number of reticles. This method cannot be said to be optimum in respect of throughput, but it has the advantage that the management is simple and the operational design of the system also becomes simple. Furthermore, there may be used a method where, based on a measured value, a coefficient of the variation calculation is automatically rewritten to an optimum coefficient.

Now, a modification of the first embodiment will be described in reference to FIGS. 5(a) and 5(b). In this modification, the pattern plate of the wafer stage WST is provided with two light transmission portions, and the distance of movement of the reticle R is measured with the state where the wafer stage remains stationary. With this, the distance of movement on the wafer side in the aforementioned embodiment is to be fixed.

Figure 5A:
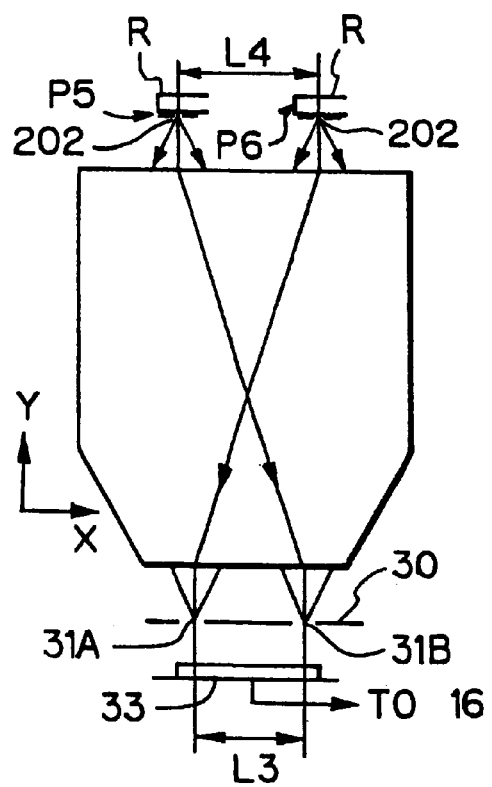
FIG. 5(a) is an elevational view showing the essential section of a modification of the first embodiment.
Figure 5B:
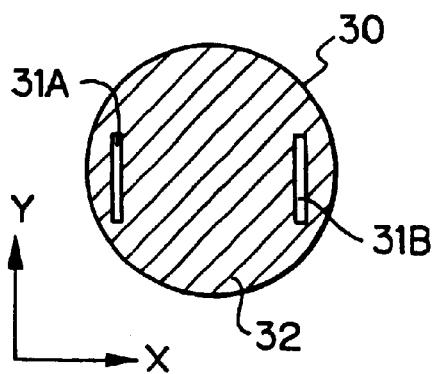
FIG. 5(b) is a plan view of the pattern plate shown in FIG. 5(a)

FIG. 5(a) shows the relationship, through the projection optical system PL, between the reticle R and the photoelectric detection system on the wafer stage WST. FIG. 5(b) shows a plan view of the pattern plate 30 of FIG. 5(a). In FIG. 5(b), the pattern plate 30 is provided with two light transmission portions 31A and 31B which are spaced at a distance of L3 apart from each other and extend in the direction perpendicular to the scanning direction. These two light transmission portions 31A and 31B are surrounded by a light shielding portion 32 and have a size substantially identical with the shape of the projected image of the reference mark 202 on the reticle R. In correspondence with this pattern plate 30, just under the pattern plate 30 there is arranged a photoelectric sensor 33 having a light-receiving surface larger than that of the photoelectric sensor 20 of the aforementioned embodiment in order to receive the illumination light beams of the two light transmission portions 31A and 31B without being moved. Other structures are the same as the aforementioned embodiment. Note that the light-receiving surface of the photoelectric sensor 33 is not limited to the wide surface of FIG. 5(a). For example, photoelectric sensors having the same light-receiving surface as the aforementioned embodiment may be provided for the light transmission portions 31A and 31B, respectively. Also, a single photoelectric sensor may be moved just under the light transmission portion 31A or 31B in correspondence with the movement of the reticle R.

In the embodiment shown in FIG. 5(a), while the wafer stage WST remains stationary, only the reticle R moves from a position P5 corresponding to the light transmission portion 31B to a position P6 corresponding to the light transmission portion 31A. More specifically, initially the wafer stage WST is moved so that the two light transmission portions 31A and 31B formed in the pattern plate 30 get into the conjugate area of the illumination area IA of FIG. 4(a). Then, with the state where the wafer stage WST remains stationary, the reticle stage is driven so that the image of the reference mark 202 of the reticle R passes through the light transmission portion 31B of the pattern plate 30. When the quantity of light becomes maximum at the photoelectric sensor 33, the X coordinate of the reticle R measured by the laser interferometer 8 is obtained. Likewise, with the state where the wafer stage WST remains stationary, the reticle stage is driven so that the image of the reference mark 202 of the reticle R passes through the light transmission portion 31A. When the quantity of light becomes maximum at the photoelectric sensor 33, the X coordinate of the reticle R is measured and obtained by the laser interferometer 8. With this, a distance L4 that the reticle R moved is measured, and the distance L4 corresponds to the distance L3 between the light transmission portions 31A and 31B (for example, distance between the longitudinal central axes of the light transmission portions) of the pattern plate 30. The magnification is obtained from a ratio of L4 to L3, i.e., L3/L4.

As described above, according to the aforementioned embodiment, the laser interferometer 10 in the wafer side is used in positioning of the wafer stage WST, but it does not have a direct relation with the measured value of the distance L3 and therefore does not become a main cause of an error of the distance L3. In the first embodiment, the distance L2 is measured by means of the laser interferometer 8 provided in the reticle side and the gap or distance L1 is measured with the laser interferometer 10 provided in the wafer side. Therefore, if a scale error resulting from wavelength correction occurs between the two laser interferometers, it will become a measurement error. However, in this embodiment, the laser interferometer 8 used for measurement is provided on the reticle side where the magnification is high, and therefore, even if an error occurs, the influence thereof would be reduced by the amount of magnification of the projection optical system PL. That is, if it is assumed that the magnification of the projection optical system PL is, for example, ¼, then the measurement error will become an error of ¼ of the measured value of the laser interferometer 10 provided in the wafer side. Note that the number of the light transmission portions formed in the pattern plate 30 on the wafer stage WST is not limited to 2 but it can be increased as needed.

Now, a second embodiment of the present invention will be described in reference to FIGS. 7(a) and 7(b). While in the first embodiment a space image has been measured, in this embodiment an image is transferred on the photoresist (photosensitive material) covering the surface of the wafer W and the transferred image is measured. The aforementioned measurement of the space image can be used as a convenient measuring method, but since an actual pattern is formed in the photoresist, finally the system needs to be inspected with the resist image for manufacturing a final product. The reason is that there are some cases where the space image does not match completely with the measured value because of the characteristic of the photoresist and the aberration of the projection optical system PL.

Briefly explained, the photoresist is in two states; an exposed state and an unexposed state, but the space image is a continuous value. Therefore, it is considered that the influence of the aberration of the projection optical system PL is different between the space image and the measured value, depending upon the signal processing of the space image. Also, since the photoresist has a thickness in the Z direction, there is a possibility that it differs from the space image which is formed on a plane. In such a case, the relationship between the resist image and the space image is obtained in advance and the measurement result of the space image needs to be corrected. Even in the resist image, problems to be solved and means for solving the problems are exactly the same as the case of the space image and therefore a detailed description is omitted by applying the same reference numerals to the same members.

The operation of the second embodiment of the present invention will hereinafter be described.

FIG. 7(a) schematically illustrates the essential part of a projection exposure apparatus according to the second embodiment. As shown in the figure, as with the first embodiment, initially a reticle R is stopped at a first reference point P7 on the left side, and a reference mark 501 on the reticle R is transferred by actual exposure light onto a photoresist layer 503 coated on a wafer W. In FIG. 7(a), a resist image 502A which is formed at a position of the projected image of the reference mark 501 after development is indicated by a broken line. At this time, the wafer stage WST and the reticle stage 4A remain stationary. Then, the reticle R is moved in the X direction by a distance L8 and gets to a second reference point P8 on the right side. In response to this movement, the wafer stage WST is moved from a point P10 to a point P9 by a distance which is shorter than a distance L7 corresponding to the distance L8 by ΔL7.

This is because measurement will become difficult if two images, exposed at two points, overlap each other, and the wafer stage WST may be moved to a position of a distance added by ΔL7. Now, an exposure operation is again performed so that an image of the reference mark 501 on the reticle is transferred onto the resist layer as a resist image 502B. In FIG. 7(a), the resist image 502B is shown at a position of the projected image of the reference mark 501 by a broken line. FIG. 7(b) shows the resist images 502A and 502B formed after development. As shown in FIG. 7(b), the resist images 502A and 502B, formed at the two reference positions by exposure, will be spaced by the distance ΔL7 if the projection magnification is exactly the same as a designed value. If, on the other hand, the magnification has an error, the resist images will be spaced by a distance, (ΔL7+α). At this time, the projection magnification is calculated as a ratio of the distance (ΔL7+α) to the distance L8, i.e., (ΔL7+α)/L8. In this way, the projection magnification of the projection optical system PL is obtained by using the photoresist image.

Generally, a measurement of distance can be made by an inspection device for inspecting overlap. In a device such as this, for example, the wafer W, as with the exposure apparatus, is mounted on a stage where a position can be precisely measured by means of a laser interferometer, and light scattered from a resist pattern is received by scanning the stage while illuminating a laser beam on an image. Some of the exposure apparatus are also capable of such measurement. Also, there is a method of exposing an image having a scale so that it can be inspected through a microscope or with the naked eye.

For the overlapping exposure at two points, measurement may be performed several times per wafer and averaged in order to increase measurement accuracy. Also, a latent image may be measured without development. In addition, a photochromic material where exposure and erase can be freely performed may be used instead of photoresist.

As with the first embodiment, measurement of image distortion will be possible if the number of reference points is increased. Also, the measurement cannot be frequently performed because it takes time as compared with the first embodiment, but since the accuracy of final products is finally determined by the photoresist image, as described above, it is preferable that this method of the second embodiment be used in a periodic inspection. Even in this case, this method is efficient because it does not need to pay attention to a drawing error of the reticle R.

Now, a third embodiment of the present invention will be described in reference to FIG. 8 and FIGS. 9(a) through 9(c). In this embodiment, a plurality of reference marks are formed on the reticle R, and using the laser interferometer of the exposure apparatus, the drawing error of the reticle R is obtained while actually measuring the error.

Figure 9A:
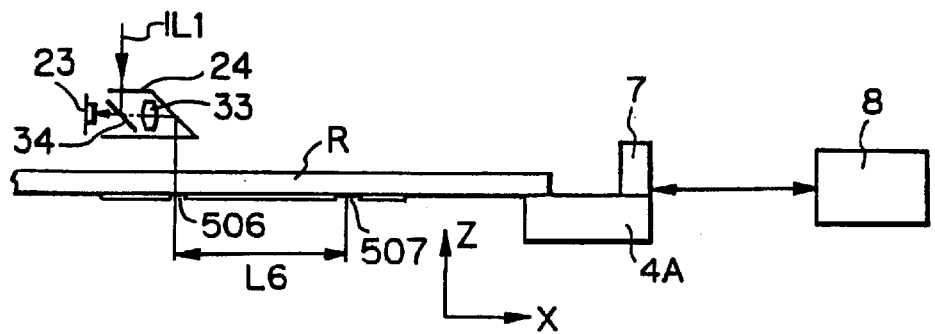
FIGS. 9(a) to 9(c) are diagrams used to explain a projection exposure apparatus for carrying out the inspection method for the projection optical system of FIG. 8, FIGS. 9(a) and 9(b) showing the location detection operation of a reference mark formed on a reticle and FIG. 9(c) showing the essential section of the exposure system.
Figure 9B:
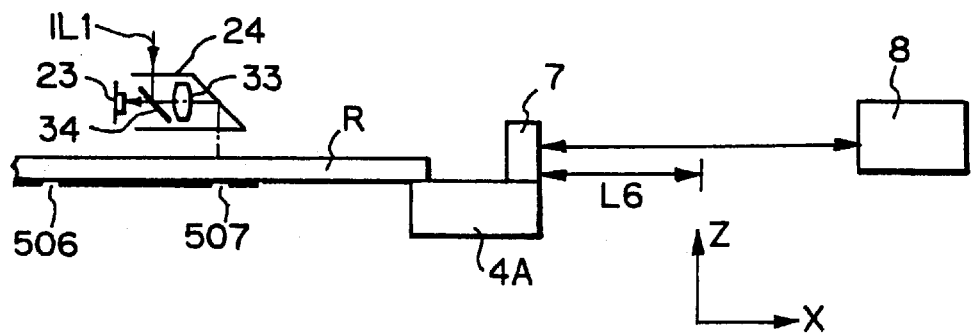
Figure 9C:
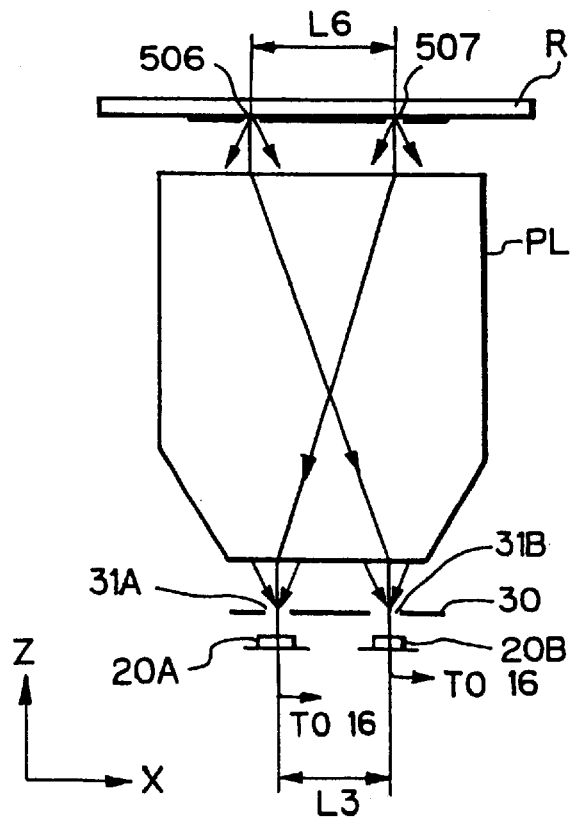

FIGS. 9(a) to 9(c) are diagrams used to explain the operation of the reticle R. FIG. 9(a) shows the state where the position of a reference mark 506 is being measured, FIG. 9(b) shows the state where the position of a reference mark 507 is being measured, and FIG. 9(c) shows the state where magnification is being measured actually. As shown in FIGS. 9(a) to 9(c), this embodiment is identical in construction with the first embodiment, except that the reticle R is provided with two reference marks 506 and 507, the pattern plate 30 used in the modification of the first embodiment is used as a pattern plate of the wafer stage WST, and two photoelectric sensors 20A and 20B for receiving projected images of the reference marks 506 and 507 are used. The same reference numerals are applied to corresponding parts and a detailed description of the corresponding parts will not be given.

In FIGS. 9(a) and 9(b), although a reticle alignment microscope 24 and a photoelectric sensor 23 are originally used for aligning the reticle R to the exposure apparatus by observing an alignment reference pattern on the reticle R and a reference pattern on the wafer stage WST, in the third embodiment the reticle alignment microscope 24, the photoelectric sensor 23, a laser interferometer 8, and a movable mirror 7 on the reticle stage are used in order to actually measure a gap or distance L6 between the reference marks 506 and 507 on the reticle R (for example, the distance between longitudinal center lines of the reference marks).

An example of the inspection operation of the projection optical system of the third embodiment will hereinafter be described in reference to FIG. 8.

FIG. 8 shows a flowchart of the inspection operation of this embodiment. Initially, in step 101a, the reticle stage 4A is moved so that the reference mark 506 on the reticle R comes just under the reticle alignment microscope 24, as shown in FIG. 9(a), and then illumination light IL1 for the reticle alignment microscope 24 is emitted. The illumination light IL1 is reflected at substantially right angles by a beam splitter 34 of the reticle alignment microscope 24, and then the light IL1 is illuminated on the reference mark 506 on the reticle through an object lens 33 and a mirror. The reflection light from the reference mark 506 is returned to the reticle alignment microscope 24 again, and passes through the object lens 33 and the beam splitter 34. As a result, an image of the reference mark 506 is formed on the photoelectric sensor 23.

The reticle R is slightly moved so that the position of the image of the reference mark 506 at the photoelectric sensor 23 is held in a predetermined reference position, and then the position of the reticle R in the X direction is measured by means of the laser interferometer 8. In step 102a the reticle stage 4A is moved so that the reference mark 507 comes just under the reticle alignment microscope 24, as shown in FIG. 9(b), and the position of the reticle R is measured in the same manner. The values measured at the two positions by means of the laser interferometer 8 are supplied to the central control system 16 through the stage control system 25. In step 103a the distance L6 between the reference marks 506 and 507 is calculated on the basis of the two measured positions by the central control system 16.

In FIG. 9(c), the respective diffraction light beams, from the reference marks 506 and 507 pass through the light transmission portions 31A and 31B in the pattern plate 30 on the wafer stage WST via the projection optical system PL, respectively, and are received by respective photoelectric sensors 20B and 20A. In this case, the distance between the two light transmission portions 31A and 31B, as with the modification of the first embodiment, is L3. When magnification is equal to a designed value, the light transmission portions 31A and 31B are set so that the images of the reference marks 506 and 507 match with the light transmission portions 31B and 31A. However, at the time of actual use, a shift occurs in the designed value of the image formation characteristics, and consequently, a shift occurs between the image forming position of the reference mark 506 and the position of the light transmission portion 31B and also between the image forming position of the reference mark 507 and the position of the light transmission portion 31A.

Therefore, in this embodiment, in step 104a the reticle stage 4A is moved and stopped so that the reference marks 506 and 507 are positioned within the illumination area IA. Then, in step 105a the wafer stage WST is moved so that the light transmission portion 31B crosses the image forming position of the reference mark 506. In step 106a the X coordinate of the wafer stage WST is obtained when the output of the photoelectric sensor 20B becomes maximum. Likewise, in step 107a the wafer stage WST is moved so that the light transmission portion 31A crosses the image forming position of the reference mark 507. In step 108a the X coordinate of the wafer stage WST is obtained when the output of the photoelectric sensor 20A becomes maximum. In step 109a the distance ΔL3 of movement of the wafer stage WST is calculated by the central control system 16.

In step 110a the projection magnification of the projection optical system PL is calculated by the central control system 16, based on the distance L6 between the reference marks 506 and 507 on the reticle R calculated in step 103a, the distance L3 between the light transmission portions 31A and 31B, and the distance ΔL3 of movement of the wafer stage WST calculated in step 109a. The magnification is obtained from a ratio of the sum of the distance of movement ΔL3 of the wafer stage WST and the distance L3 to the distance L6 between the reference marks 506 and 507 of the reticle R, i.e., (L3+ΔL3)/L6. Based on the foregoing results, in step 111a the correction of the projection magnification of the projection optical system PL is made by the central control system 16.

To perform measurement with higher accuracy, the wafer stage side may remain stationary and the reticle stage side may be scanned. In this case, initially the reticle stage 4A is moved and the position of the reticle stage 4A is detected when the output of the photoelectric sensor 20B becomes maximum. Then, the reticle stage 4A is moved and the position of the reticle stage 4A is detected when the output of the photoelectric sensor 20A becomes maximum. At this time, a ratio of the sum of the product of a difference ΔL6 of the measured positions of the reticle stage 4 and the projection magnification β and the distance L3 to the distance L6 between the reference marks 506 and 507 of the reticle, i.e., (L3+ΔL6·β)/L6 is obtained as projection magnification.

According to the third embodiment, as with the first embodiment, measurement where there is no influence of the drawing error of the reticle R is possible. Also, the mark gap of the reticle R is measured according to this embodiment. Therefore, even if the reticle R absorbed illumination light and were thermally expanded, the variation quantity could be known. Also, even if variations in magnification and image distortion, including the quantity of the thermal expansion of the reticle R, occurred, the variation quantity could be known. (The quantity of the thermal expansion of the reticle R cannot be measured in principle with the first and second embodiments). Also, the thermal expansion of the reticle R could be known from the variation of mark spacing, while the variations in magnification and image distortion could be known by subtracting the quantity due to thermal expansion of the reticle R from the entire variation, respectively. Therefore, the magnification and the image distortion can be calculated respectively by the aforementioned image formation characteristics calculating device. And also, the accuracy of correction calculation between calibrations can be increased.

When the thermal expansion of the reticle R does not have an influence on accuracy, the measurement of the reference mark gap is performed once at the time of the exchange of the reticle R and, therefore, in the measurement of a case where a plurality of transmission portions are used like the aforementioned embodiment, the measuring time can be shortened.

Also, in the third embodiment, furthermore, two reference marks may be formed on the reticle R in a direction (Y direction) perpendicular to the scanning direction, and as with the third embodiment, a gap or distance between the two reference marks may be measured with the reticle R turned 90°. Then, by again turning the reticle R 90° and measuring the distance between two images in the Y-direction at the wafer stage side, the projection magnification of the projection optical system in the Y direction can be measured.

While in the first and third embodiment the measurement of the space image has been performed using the light-receiving sensor provided in the wafer stage side, the light-receiving sensor may be arranged in front of the reticle, and illumination light may be emitted at the wafer stage side and received through the reticle. If this method is applied, for example, to the first embodiment, slit-shaped illumination light will be emitted from the wafer stage side and the wafer stage WST is scanned so that a slit scans the reference mark 202 of the reticle. Since a light beam passes through the reticle R upward when the reference mark 202 and the slit are aligned, the inverted image forming position of the slit to the reticle can be known by receiving the transmitted light beam. However, since this method does not use an actual illumination system for the reticle R, consideration needs to be given to the fact that the method cannot cope with a variation in illumination conditions.

A fourth embodiment of the inspection method of the projection optical system according to the present invention will hereinafter be described in reference to FIG. 10 and FIGS. 11(a) through 11(c). This embodiment is applied to a step-and-scan projection exposure apparatus where patterns of a reticle as a mask are serially transferred to shot areas of a photosensitive substrate (wafer), while scanning the reticle and the wafer in synchronization. In the apparatus shown in FIG. 10 and FIGS. 11(a) to 11(c), the same reference numerals will be applied to constitutional elements corresponding to the constitutional elements of the projection exposure apparatus of the first embodiment shown in FIG. 3 and FIGS. 4(a) to 4(d), and a detailed description of the structure, the function, and the operation of the corresponding elements is omitted.

Since the projection exposure apparatus of this embodiment is the step-and-scan type, as described above, an approach run section 29 is provided in a reticle stage 4A. Within the approach run section 29 there is provided a reference plate 27. The approach run section is an area where illumination light for exposure is illuminated at the time of the acceleration or deceleration of scan and exposure.

Figure 11A:
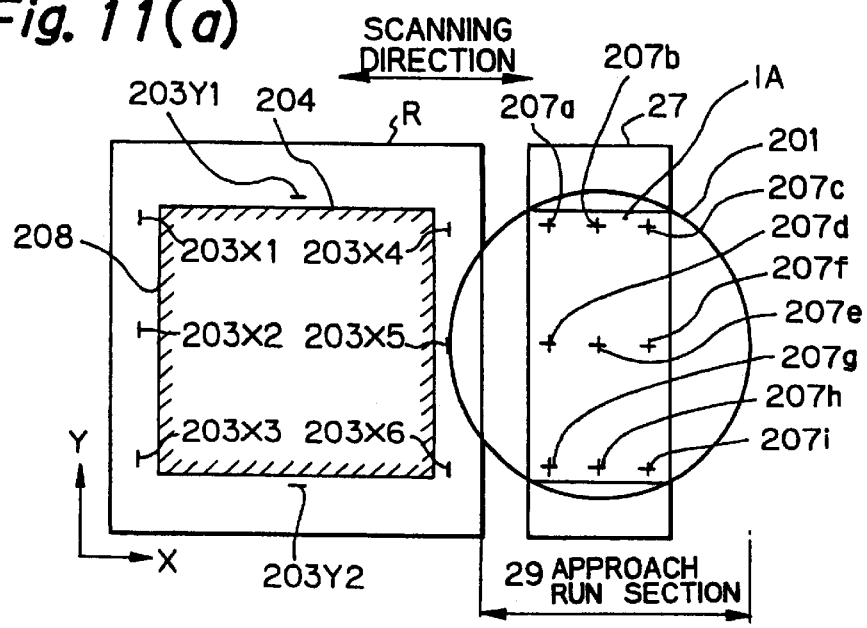
FIGS. 11(a) to 11(d) are diagrams used to concretely explain the inspection method for the projection optical system of FIG. 10, FIG. 11(a) being a plan view showing reference marks formed on a reference plate provided on a reticle stage, FIG. 11(b) being an elevational view showing the essential section of the exposure apparatus of FIG. 10, FIG. 11(c) being a plan view of a pattern plate used in the constitution of FIG. 11(b), and FIG. 11(d) being a graph showing an output curve of a photoelectric sensor.

FIG. 11(a) is a plan view showing the structure and arrangement of the reticle R and the reference plate 27 on the reticle stage 4A. As shown in FIG. 11(a), a circuit pattern 204 is drawn in the rectangular pattern area of the central portion of the reticle. The pattern area is surrounded by a box-shaped light-shielding band 208. In the central portion of the left side (the side in −X direction) adjacent to the light-shielding band 208, slit-shaped reference marks 203X1 to 203X3 extending in a direction perpendicular to the scanning direction are formed from top (the side in +Y direction) of the reticle R at intervals of an equal distance. Likewise, in the central portion of the right side (X direction) adjacent to the light-shielding band 208, slit-shaped reference marks 203X4 to 203X6 are formed in positions corresponding to the positions of the reference marks 203X1 to 203X3 in the scanning direction. Furthermore, in the central portions of the upper and lower sides (the sides in +Y direction and −Y direction) adjacent to the light-shielding band 208, long slit-shaped reference marks 203Y1 and 203Y2 extending in the scanning direction are formed parallel to the X axis. The aforementioned reference marks 203X1 to 203X6, 203Y1, and 203Y2 are used for measuring a quantity of thermal expansion of the reticle R which will be described later. In the following description, when any one of these reference marks 203X1 to 203X6, 203Y1, and 203Y2 is expressed, it will be expressed as reference mark 203.

The reference plate 27 comprises a glass plate where the width of the direction perpendicular to the scanning direction of the reticle R is equal to the size of the same direction of the reticle R. The reference plate 27 is provided within an approach run section 29 in the vicinity of the scanning direction of the reticle R. In the light-shielding film of the under surface of the reference plate, reference marks comprising 9 cross-shaped aperture patterns are formed in the form of a matrix of 3-column×3-row at intervals of substantially an equal distance in the X and Y directions. The first row reference marks 207a to 207c of the uppermost portion, the second row reference marks 207d to 207f of the intermediate portion, and the third row reference marks 207g to 207i of the lowermost portion are all arranged in a long and narrow illumination area IA within an effective field 201 on the reticle side of the projection optical system PL. In the following description, as with the reference mark 203, when any one of these reference marks 207a to 207i is expressed, it will be expressed as reference mark 207.

In FIG. 11(a), in a scan type projection exposure apparatus such as this embodiment, only the illumination area IA within the effective field 201, which is a field where an image can be formed through the projection optical system PL, is used in exposure. In FIG. 11(a), not the reticle R but the reference plate 27 is illuminated by the illumination area IA. Note that, during scan and exposure, the pattern area of the reticle R is scanned with respect to the illumination area IA.

Figure 10:
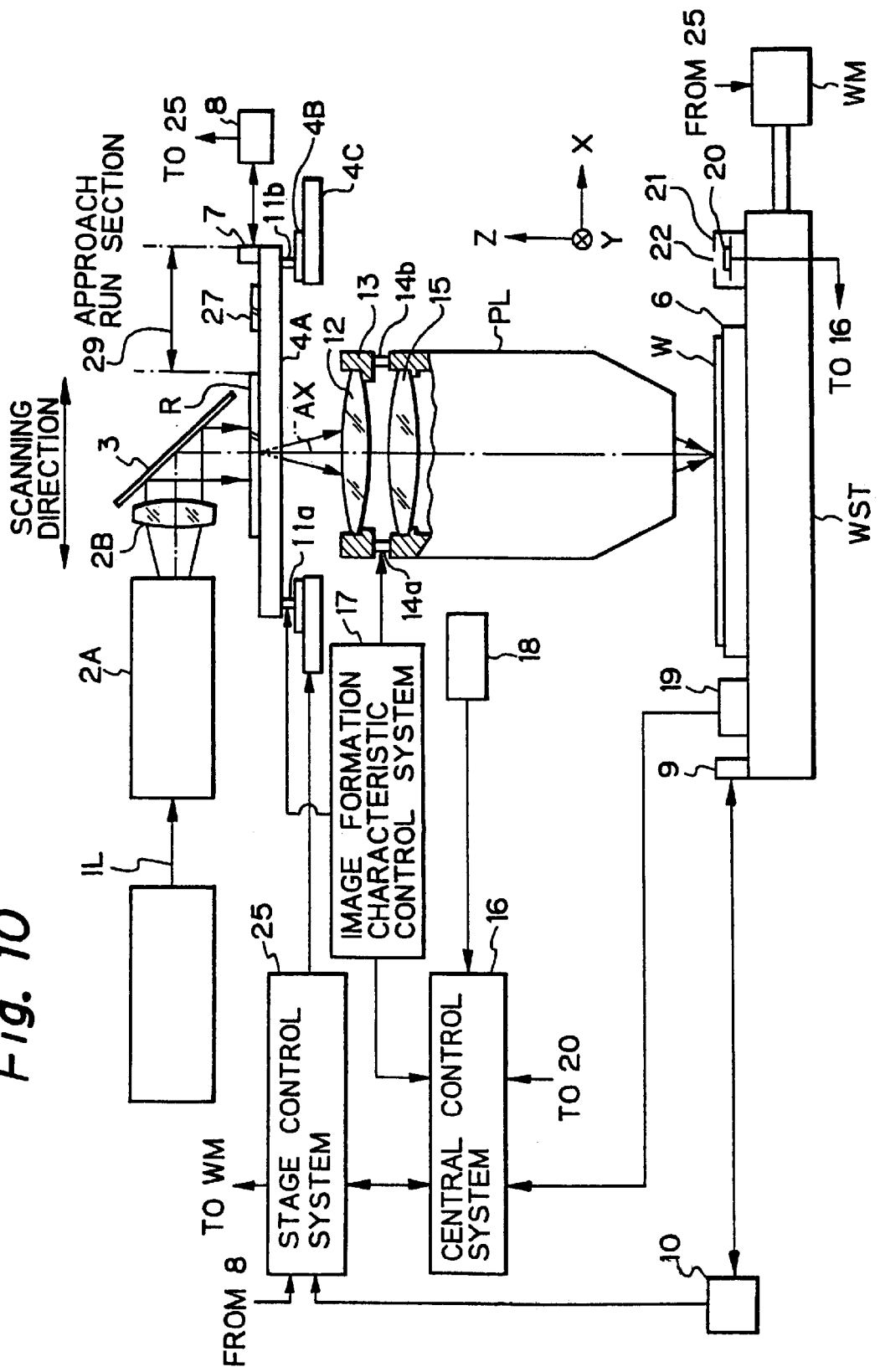
FIG. 10 is a schematic view showing, partly in cross section, a projection exposure apparatus for carrying out another inspection method for the projection optical system according to the present invention.

As shown in FIG. 10, the reference plate 27 is provided within the approach run section 29 of the reticle stage 4A. In the scan type exposure apparatus, an approach run section is provided on the reticle stage 4A, and when the reticle R is scanned in a predetermined direction, the speed of the reticle stage 4A reaches a fixed speed before the pattern area of the reticle R gets into the rectangular illumination area IA. When, on the other hand, the reticle R is scanned in the opposite direction, the deceleration of the reticle stage 4A is performed at the approach run section 29. Therefore, this approach run section 29 is space specific for the scanning-type exposure apparatus, and normally the interval is not provided in exposure apparatus of one-shot exposure types such as a stepper. The center of the reference plate 27 can be moved up to the optical axis AX of the projection optical system PL by the reticle stage 4A, and at the time of the measurement of the image formation characteristics, the center of the reference plate 27 is moved to the optical axis of the projection optical system PL.

Returning to FIG. 10, the illumination light IL having passed through the reticle R enters into the double-sided telecentric projection optical system PL. Then, the circuit pattern 204 on the reticle R is reduced at projection magnification β by the projection optical system PL, and the circuit pattern 204 is transferred to a thin layer of photosensitive material (called photoresist) covering the surface of the wafer W. While the projection optical system PL of this embodiment is provided with a mechanism for correcting image formation characteristics, this correction mechanism will be described in detail later.

In the projection exposure apparatus of this embodiment, when the aforementioned circuit pattern on the reticle R is transferred on the surface of the wafer W by the scanning-exposure method, the reticle R is illuminated at the rectangular (slit-shaped) illumination area IA extending in the direction (Y direction) perpendicular to the scanning direction of the reticle R shown in FIG. 11(a), and at the same time the reticle R is scanned, for example, at a scanning velocity $V_R$ in the +X direction (or -X direction). The pattern provided in the illumination area IA (where the center of the area IA is substantially aligned with the optical axis AX) is projected through the projection optical system PL on the slit-shaped projection area of the wafer W of FIG. 10. Since the wafer W and the reticle R are in an inverted image relationship, the wafer W is scanned at a scanning velocity $V_W$ in the -X direction (or +X direction) opposite to the direction of the velocity $V_R$ in synchronization with the reticle R. A ratio of the velocity $V_W$ to the velocity $V_R$, i.e., $V_W/V_R$ is exactly equal to the projection magnification β of the projection optical system PL. The width of the illumination area IA in the Y direction is set wider than the pattern area of the reticle R so that the entire surface of the pattern area can be illuminated by scanning the reticle R and the wafer W. Note that the scanning velocity $V_R$ of the reticle R is determined by the illuminance of the image surface and the sensitivity of the photoresist on the wafer W.

Also, the wafer W is held on a wafer holder 6 by vacuum suction, and the wafer holder 6 is mounted on a wafer stage WST. The wafer holder 6 is tiltable in any direction with respect to an optimum image plane of the projection optical system by a bottom drive unit and is able to move slightly in the direction (Z direction) parallel with the optical axis AX. The wafer holder is also rotatable about the optical axis AX by means of a bottom rotary table. On the other hand, the wafer stage WST is movable not only in the aforementioned scanning direction (X direction) but also in the direction (Y direction) perpendicular to the scanning direction so that it can move to any desired shot area of a plurality of shot areas at any time. With this arrangement, the wafer stage WST performs a step-and-scan operation where an operation scanning and exposing a shot area of the wafer W and an operation moving up to an exposure starting position of the next shot area are repeated.

The wafer stage WST is driven in the X and Y directions by means of a wafer stage drive system WM, such as a motor. To the end portion of the upper surface of the wafer stage WST, a movable mirror 9 for reflecting a laser beam emitted from an externally provided laser interferometer 10 is fixed so that the position on the X-Y plane of the wafer stage WST can be detected at all times with resolution of, for example, the order of 0.01 µm by the laser interferometer 10. The position information (or velocity information) of the wafer stage WST is sent to a stage control system 25. The stage control system 25 controls the operation of the wafer stage drive system WM, based on the position information (or velocity information). The position information (or velocity information) of the wafer stage SWT detected by the laser interferometer 10 is also supplied to the central control system 16 through the stage control system 25. Based on this information, the central control system 16 controls the stage control system 25.

The exposure apparatus shown in FIG. 10 is further provided with an oblique incidence type focus position detecting system (not shown). The focus position detecting system comprises a light-emitting system and a light-receiving system. The light-emitting system obliquely supplies image forming light beam for forming a pinhole image or a slit image onto the exposure surface of the wafer W with respect to the optical axis AX, while the light-receiving system receives reflected light beam reflected at the exposure surface of the wafer W through a slit. The Z-direction position information of the wafer W from the focus position detecting system is supplied to the central control system 16. The central control system 16 controls the wafer stage WST so that the Z direction position and the tilt angle of the water W correspond to the image forming surface of the projection optical system PL.

Now, for a photoelectric detection system which is a mark detector on the wafer stage WST, a description will be made with reference to FIG. 10 and FIGS. 11(a) to 11(c). The photoelectric detection system used herein is disclosed, for example, in Japanese Patent Laid-Open Publication No. Sho 59-94032, and photoelectrically detects the pattern in the reticle R side through the projection optical system PL. Although there is a correction method of calculating a change in the image formation characteristics, the aforementioned photoelectric detection system is used in a method of directly observing a space image of the projection optical system PL to obtain the image formation characteristic.

In FIG. 10, a pattern plate 21 is fixed on the wafer stage WST such that the upper surface thereof is the same level as that of the wafer W and is provided with a slit-shaped light transmission portion 22 extending in the Y direction.

Figure 11B:
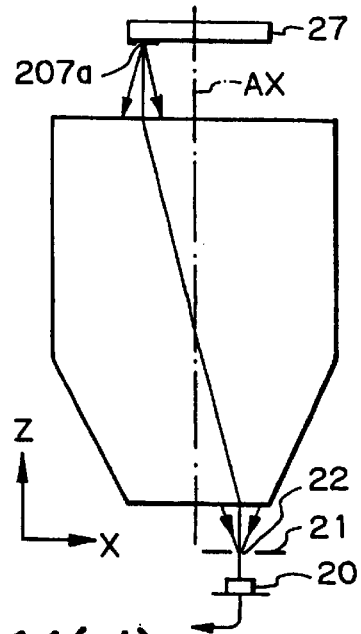
Figure 11C:
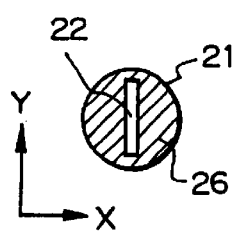

FIG. 11(c) shows a plan view of the pattern plate 21. The light transmission portion 22 surrounded by the light shielding portion 26 of the pattern plate 21 has substantially the same size as a projected image, projected on the pattern plate 21 of the reference mark 207 on the reference plate or the reference mark 203 on the reticle R. A photoelectric sensor 20 such as a silicon photodiode is provided under the light transmission portion 22, as shown in FIG. 11(b), and the projected image of the reference mark 207 or 203 through the projection optical system PL is sensed by the photoelectric sensor 20. Information as to the projected image of the reference mark 207 or 203 sensed by the photoelectric sensor 20 is supplied to the central control system 16.

Now, the correction mechanism of the image formation characteristics of the projection optical system PL will be described in detail with reference to FIG. 10. This correction mechanism corrects a variation in the image formation characteristics of the projection optical system PL itself, caused by a variation in the atmospheric pressure, illumination light absorption, and a change in illumination conditions, and also has a function which distorts the projected image of the reticle R in correspondence with a distortion of the previous exposure shot area on the wafer W. A description of the correction mechanism will hereinafter be made.

As shown in FIG. 10, in this embodiment the correction of the image formation characteristics is performed by driving the reticle stage 4A having the reticle R mounted thereon or a lens element 12 of the projection optical system PL by means of the image formation characteristic control system 17. In the projection optical system PL, the lens element 12 nearest to the reticle R is fixed to a support member 13. A lens element 15 following the lens element 12 and subsequent elements after the lens element 15 are fixed to the main lens barrel of the projection optical system PL. In this embodiment, the optical axis AX of the projection optical system PL represents an optical axis of the optical system (lens element 15 and subsequent elements) of the main body of the projection optical system PL. The support member 13 is coupled to the main lens barrel of the projection optical system through drive elements comprising at least two piezoelements capable of expansion and contraction (in FIG. 10 only two drive elements 14a and 14b are shown).

The lens element 12 can be moved parallel to the optical axis AX and also tilted with respect to the plane perpendicular to the optical axis AX by the expansion and contraction of the drive elements 14a and 14b so that the image formation characteristics of the projection optical system PL, for example, projection magnification, distortion, curvature of field, and astigmatism can be corrected. Likewise, the image formation characteristic control system 17 moves or tilts the reticle R by the expansion and contraction of the drive elements 11a and 11b to correct the image formation characteristics. A photoelectric sensor 19 is fixedly mounted on the wafer stage WST for measuring a quantity of the illumination light which passes through the projection optical system PL. An environmental sensor 18 is arranged in the vicinity of the projection optical system PL for sensing an atmospheric pressure. The outputs of the photoelectric sensor 19 and the environmental sensor 18 are supplied to the central control system 16. Based on these outputs, the central control system 16 calculates a quantity of variation in the image formation characteristics, as will be described later.

Now, an example of the operation of the projection optical system of this embodiment will be described in reference to FIG. 10 and FIGS. 11(a) to 11(d).

In FIG. 10, by an instruction of the central control system 16, illumination light IL is illuminated from a light source I and also the reticle stage 4A is moved by the stage control system 25 so that the center of the reference plate 27 comes to the vicinity of the optical axis AX. The reticle stage 4A is stopped at the position and then the wafer stage WST is moved so that the light transmission portion 22 in the pattern plate 21 on the wafer stage WST crosses a roughly estimated position of a projected image of the reference mark 207a of FIG. 11(a) which is obtained through the projection optical system PL. Then, when the output of the photoelectric sensor 20 reaches its peak, the X coordinate of the wafer stage WST is obtained by a laser interferometer 10.

FIG. 11(b) shows the relationship, through the projection optical system PL, between the reference plate 27 and the photoelectric detection system on the wafer stage WST. The light transmission portion 22 in the pattern plate 21 on the wafer stage WST passes through the vicinity of an image forming position of the reference mark 207a on the reference plate 27.

Figure 11D:
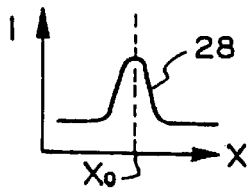

FIG. 11(d) shows a graph illustrating the relationship between the position of the wafer stage WST and the quantity of the received light of the photoelectric sensor 20. In FIG. 11(d) the axis of abscissa represents a position x of the wafer stage WST and the axis of ordinate represents an intensity I of the light obtained at the light-receiving surface of the photoelectric sensor 20. A waveform curve 28 showing the intensity I of the light is taken into a storage portion of the central control system 16 in correspondence with X coordinates.

Based on the waveform curve taken in, the central control system 16 obtains a position $x_0$ where the output of the photoelectric sensor 20 becomes maximum. The obtained position $x_0$ is an image forming position of the reference mark 207a on the wafer stage WST.

Then, the wafer stage WST is moved so that the light transmission portion 22 in the pattern plate 21 on the wafer stage WST crosses a roughly estimated position of a projected image of the reference mark 207b of FIG. 11(a) which is obtained through the projection optical system PL. Then, when the output of the photoelectric sensor 20 reaches its peak, the X coordinate of the wafer stage WST is obtained by a laser interferometer 10.

The measured value of the laser interferometer 10 is sent to the central control system 16 through the stage control system 25. In the central control system, a gap or distance between the image forming position of the reference mark 207a and the image forming position of the reference mark 207b is calculated. The distance between the image forming positions calculated by the central control system 16 is referred to as a distance M1. The gap or distance between the reference marks on the reference plate 27 has been precisely measured by a pattern measuring machine in advance and input to the central control system 16. If a distance between the designed values of the reference marks 207a and 207b is expressed as M2, then the projection magnification of the projection optical system will be obtained as a ratio of the distance M1 to the distance M2, i.e., M1/M2. Based on the foregoing results, the central control system 16 corrects the projection magnification of the projection optical system PL via the image formation characteristic control system 17.

Since in this embodiment the mark 207 specific for the system is used, there is the problem that distortion matching is difficult to perform between systems, but if, for example, a position error of each reference mark 207 with respect to a reference reticle is managed, then the same reference reticle will be used in each system and measurement can be performed.

While the foregoing description has been made of the method of measuring an image formation characteristic in the X direction, it is true of Y-direction projection magnification. For example, as with the X direction, measurement can be performed by using the reference marks 207a and 207g arranged on the reference plate 27 in the Y direction.

Note that the image distortion within the illumination area IA is obtained by performing the aforementioned measurement using a greater number of reference marks 207. Since this method also finds the contrast of an image, a focus position can also be measured by checking the contrast while varying the position of the light transmission portion 22 in the direction along the optical axis (Z direction). Note that there is also a method which enhances measurement reproducibility by using a plurality of lines instead of the reference mark 207 of this embodiment comprising a single line, and averaging the measurement result. Coma can also be measured by measuring linewidths of a plurality of parallel spaced lines.

While, in this embodiment, measurement has been performed only by a single light transmission portion 22 provided on the wafer stage WST, a plurality of light transmission portions can be provided in correspondence with the number of reference marks 207, and the image forming positions of the plurality of reference marks 207 through the projection optical system PL can be measured at a time with a single scanning. In this case, if the distance between the light transmission portions has been previously measured precisely, there will be the advantage that, even if there were a scale error in the laser interferometer 10, the error would have no influence on measurement accuracy. Also, since the measurement of the image formation characteristics can be performed with a single scanning, measuring time is shortened. Therefore, throughput (producibility) is enhanced.

Although, in this embodiment, reticle stage 4A remains stationary and the wafer stage WST is slightly moved to measure the image forming position of the reference mark 207 on the reference plate 27, the reticle stage 4A may be driven and the wafer stage WST may be remained stationary, because the reference mark 207 and the photoelectric detection system on the wafer stage may perform a relative scan. Also, while in this embodiment there has been shown a measuring method using the slit-shaped light transmission portion 22, any method can be used if it is a method of obtaining an image formation characteristic from a space image.

Note that the pattern plate of FIGS. 6(a) to 6(d), which has been described as a modification of the aforementioned first embodiment, can also be used as a modification of the pattern plate used in the aforementioned fourth embodiment. In addition, the correction operation of the projection optical system PL of the aforementioned first embodiment, as it is, can be applied as the correction operation of the projection optical system PL of the aforementioned fourth embodiment. Therefore, a detailed description of the correction operation is omitted. Furthermore, the correction operation of this embodiment, which corrects a variation in the image formation characteristics caused due to a variation in environments such as atmospheric pressure, illumination light absorption of the projection optical system, or a change in illumination conditions, is also substantially identical to the correction operation of the aforementioned first embodiment. Therefore, a detailed description of the correction operation is also omitted.

Now, in this embodiment, an example of an operation, where the degree of thermal expansion of the reticle is measured and correction is performed based on the measurement, will be described with reference to FIG. 10 and FIGS. 11(a) to 11(d). In this example, a description will be made of a measuring method of the X direction of the reticle R.

As described above, the reference mark 203 for measurement is formed on the reticle R. The marked position of the reference mark 203 is not known accurately due to a drawing error. Then, the reticle stage 4A is moved and stopped so that, for example, the reference mark 203X1 gets into the illumination area IA. The position of the stopped reticle stage 4A is measured. Then, the wafer stage WST is moved so that the light transmission portion 22 in the pattern plate 21 on the wafer stage WST crosses a roughly estimated position of an image of the reference mark 203X1 which is projected through the projection optical system PL, and the wafer stage WST is stopped at a position where the output of the photoelectric sensor 20 reaches its peak.

While the wafer stage WST remains stationary, the reticle stage 4A is moved so that the projected image of the reference mark 203X4 through the projection optical system PL crosses the light transmission portion 22 in the pattern plate 21 on the wafer stage WST. When the output of the photoelectric sensor 20 reaches its peak, the position of the reticle stage 4A is measured. With the condition the wafer stage WST remains stationary, the distance of movement of the reticle stage 4A is calculated by the central control system 16.

Now, it is assumed that the distance of movement of the reticle stage 4A is a distance M3, and a designed value of the gap or distance between the reference marks 203X1 and 203X4 on the reticle R is a distance M4. Assuming the image distortion measured by the reference mark 205 is a distance ΔM, an error ΔS from the designed value of the gap or distance between the reference marks 203X1 and 203X4 is obtained from (M3-M4-ΔM).

This error ΔS consists of a drawing error and a quantity of thermal expansion of the reticle R in the lateral direction (X direction). If the reticle R is in its normal state, the error ΔS will only be a drawing error, but if the reticle R absorbs illumination light and is thermally expanded, a quantity of thermal expansion will be added. Therefore, if the drawing error between the reference marks 203X1 and 203X4 is obtained when the reticle R is in the normal state, the quantity of thermal expansion of the reticle can be calculated. In this way, the quantity of thermal expansion of the X direction of the reticle R. For the Y direction, a quantity of thermal expansion can be obtained in the same way by using, for example, the reference marks 203Y1 and 203Y2.

Even in the aforementioned method of calculating and correcting a quantity of variation of an image formation characteristic, there is considered a method, as with the correction of the image formation characteristic of the projection optical system PL, a quantity of thermal expansion of the reticle is measured during exposure and a correction error is corrected by measurement, although there has been considered a method of calculating a quantity of thermal expansion of the reticle from an existence rate of the reticle pattern and an intensity of the illumination light of the reticle surface. Also, if a drawing error is obtained once, it will not need to be measured with the reference plate 27, and if the drawing error is measured with the reference mark 203 of the reticle R, image distortion including the thermal expansion of the reticle R can be measured. In this method, the quantity of the thermal expansion of the reticle and the quantity of the image distortion of the projection optical system PL can not be separated, but a measuring time can be shortened.

Since the thermal expansion of the reference plate 27 itself, caused by absorption of illumination light, results in a measurement error, consideration must be given so that the reference plate 27 is formed from material whose thermal absorption coefficient and thermal expansion coefficient are as low as possible and also the reference plate 27 itself does not expand thermally by shortening a measuring time. For this reason, there is also considered a method where only a necessary place is illuminated with a reticle blind and the image formation characteristic of the projection optical system PL is measured.

Now, a fifth embodiment of the projection optical system according to the present invention will be described with reference to FIGS. 12(*a*) and 12(*b*). While in the first embodiment a space image has been measured, in this embodiment an image is transferred on the photoresist applied on the surface of the wafer W and the transferred image is measured. The aforementioned measurement of the space image can be used as a convenient measuring method, but since an actual pattern is formed in the photoresist, it is preferable to finally inspect the resist image for manufacturing a final product. The reason is that there are some cases where the space image does not match completely with the measured value because of the characteristics of the photoresist and the aberration of the projection optical system PL.

Briefly explained, the photoresist is in two states; an exposed state and an unexposed state, but the space image is a continuous value. Therefore, it is considered that the influence of the aberration of the projection optical system PL is different between the space image and the measured value, depending upon the signal processing of the space image. Also, while the resist image has a thickness, there is possibility that it differs from the space image which is formed on a plane. In such a case, the relationship between the resist image and the space image is obtained in advance and the measurement result of the space image needs to be corrected. Even in the resist image, problems to be solved and means for solving the problems are exactly the same as the case of the space image. Since the fifth embodiment is identical in structure to the first embodiment, a detailed description is omitted by applying the same reference numerals to the same members.

The operation of the fifth embodiment of the present invention will hereinafter be described. The same reference numerals will be applied to constitutional elements corresponding to the constitutional elements of the embodiment shown in FIGS. 7(*a*) and 7(*b*) and therefore a detailed description of the corresponding elements is omitted.

Figure 12A:
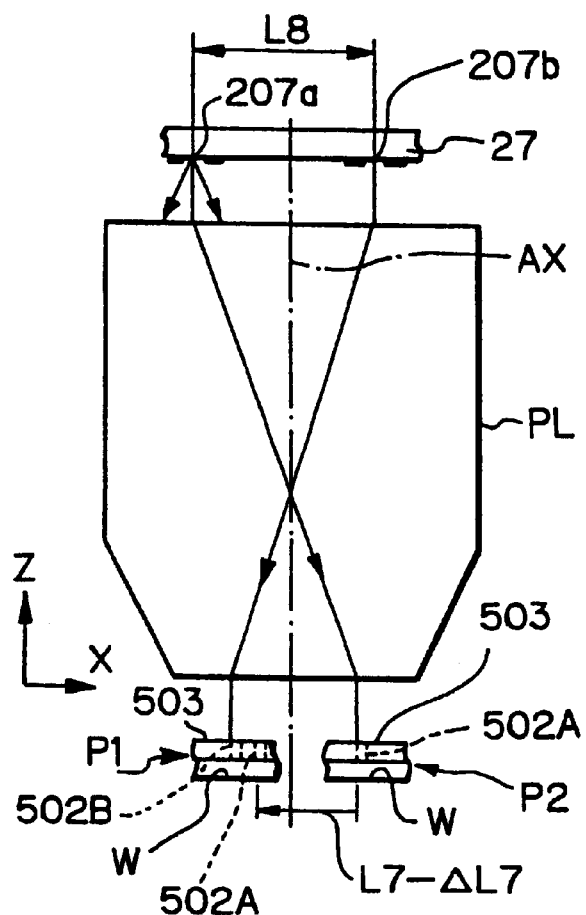
FIG. 12(a) is a schematic view showing the essential part of a projection exposure apparatus for explaining another embodiment of the inspection method for the projection optical system according to the present invention.
Figure 12B:
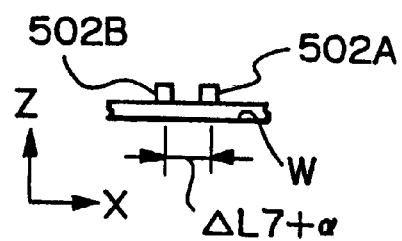
FIG. 12(b) is a view showing a resist image formed by exposure in the second embodiment.

FIG. 12(*a*) schematically illustrates the essential part of a projection exposure apparatus of the fifth embodiment. As shown in the figure, as with the fourth embodiment, initially illumination light IL is illuminated from a light source I by an instruction of a central control system 16. A reticle stage 4A is moved by a stage control system 25 so that the center of a reference plate 27 comes to the vicinity of the optical axis AX of a projection optical system PL. The reticle stage 4A is then stopped at the position and a wafer stage WST is moved to a point P2 so that a wafer W comes to an exposure position of a projected image of a reference mark 207*a* which is obtained through the projection optical system PL.

An image of a reference mark 207*a* is transferred by actual exposure light onto a photoresist layer 503 coated on the wafer W. In FIG. 12(*a*), a resist image 502A which is formed at a position of the projected image of the reference mark 207*a* after development is indicated by a broken line. At this time, the wafer stage WST and the reticle stage 4A remain stationary. Then, while the reticle stage 4A remains stationary, the wafer stage WST is moved up to a point P1 of a distance which is shorter by ΔL7 than a distance L7 between the image forming positions of reference marks 207*a* and 207*b* corresponding to a distance L8 between reference marks 207*a* and 207*b*. This is because measurement will become difficult if two images, exposed at two points, overlap each other, and the wafer stage WST may be moved to a position of a distance added by ΔL7.

Now, an exposure operation is again performed so that an image of the reference mark 207*b* on the reticle is transferred onto the resist layer as a resist image 502B. In FIG. 12(*a*), the resist image 502B is shown at a position of the projected image of the reference mark 207*b* by a broken line. FIG. 12(*b*) shows the resist images 502A and 502B formed after development. As shown in FIG. 12(*b*), the resist images 502A and 502B, formed at the two reference positions by exposure, will be spaced by the distance ΔL7 if the projection magnification is exactly the same as a designed value. If, on the other hand, the magnification has an error, the resist images will be spaced by a distance, (ΔL7+α). At this time, the projection magnification is calculated as a ratio of the distance (ΔL7+α) to the distance L8, i.e., (ΔL7+α)/L8. In this way, the projection magnification of the projection optical system PL is obtained by using the photoresist image.

Generally, a measurement of distance can be made by an inspection device for inspecting overlap. In a device such as this, for example, the wafer W, as with the exposure apparatus, is mounted on a stage where a position can be precisely measured by mean of a laser interferometer, and light scattered from a resist pattern is received by scanning the stage while illuminating a laser beam on an image. Some of the exposure apparatus are also capable of such measurement. Also, there is a method of exposing an image having a scale so that it can be inspected by a microscope or with the naked eye. In addition, a plurality of reference marks 207 on the reference plate 27 may be exposed by one-shot while the wafer remains stationary, and the distance may be measured. However, in such a case, an error will be increased if the wafer W expands or contracts until measurement.

For the overlapping exposure at two points, measurement may be performed several times per wafer and averaged in order to increase measurement accuracy. Also, a latent image may be measured without development. In addition, a photochromic material where exposure and erase can be freely performed may be used instead of photoresist.

As with the fourth embodiment, measurement of image distortion will be possible if the number of reference points is increased. Also, the measurement cannot be frequently performed because it takes time as compared with the fourth embodiment, but since the accuracy of final products is finally determined by the photoresist image, as described above, it is preferable that this method be used in a periodic inspection. Even in this case, this method is efficient because it does not necessary to pay attention to a drawing error of the reticle R.

While the fourth and fifth embodiments have been described by way of the scanning type projection exposure apparatus, the present invention is also applicable to projection exposure apparatus of one-shot exposure types. Even the collective type projection exposure apparatus, as they are, can be applied if the apparatus has a movable reticle stage as the aforementioned embodiments have. For example, when patterns of a plurality of reticles are serially transferred on a single wafer, the reference plate can be used if a projection exposure apparatus is constructed so that a plurality of reticles can be serially moved into an illumination area. The present invention is also applicable to normal projection exposure apparatus of one-shot exposure types which do not have the aforementioned construction.

For a case where the present invention is applied to the one-shot type projection exposure apparatus, a description will hereinafter be described with reference to FIGS. 13(a) to 13(c) and FIG. 16. While in the scanning type projection exposure apparatus the circuit patterns of the reticle are serially transferred onto the wafer by scanning the reticle R and the wafer W in synchronization with each other, in the one-shot type projection exposure apparatus the circuit patterns of a reticle are transferred on the wafer by one-shot. Therefore, particularly the structure of the periphery of the reticle stage and the illumination area of the one-shot type projection exposure apparatus are different from those of the scan type projection exposure apparatus, but the structure, shown in FIGS. 13(a) to 13(c) and FIG. 16, of the illumination system, the projection optical system, and the periphery of the wafer are the same as the scanning type projection exposure apparatus of FIG. 10. The same reference numerals will be applied to parts corresponding to FIG. 10 and therefore a detailed description of the corresponding parts is omitted.

Initially, a sixth embodiment of the projection exposure apparatus according to the present invention will be described in reference to FIGS. 13(a) through 13(c).

Figure 13A:
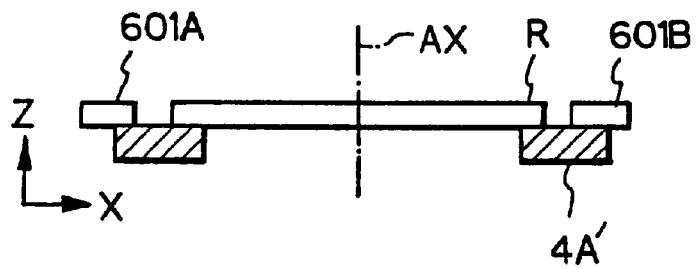
FIGS. 13(a) to 13(c) are views showing the periphery of a reticle stage for explaining another embodiment of the projection exposure apparatus of the present invention, FIGS. 13(a) and 13(b) being cross-sectional views and FIG. 13(c) being a plan view.
Figure 13B:
Figure 13C:
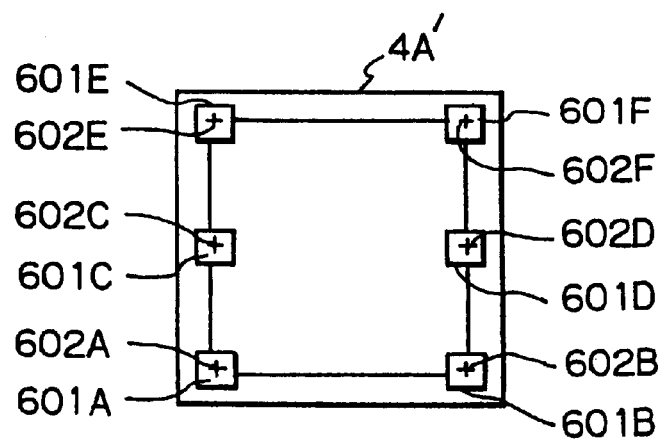

FIGS. 13(a) and 13(c) shows the periphery of a reticle stage of the projection exposure apparatus of this embodiment. FIG. 13(a) shows the state as exposure is performed, FIG. 13(b) shows the state as the reticle is exchanged, and FIG. 13(c) shows a plan view of the reference plate of FIG. 13(b). In FIG. 13(a), the reticle R is mounted on a reticle holder 4A'. A plurality of reference plates 601A to 601F are mounted on the outer peripheral portion of the reticle R on the reticle holder 4A', as shown in FIG. 13(c). The reference plates 601A to 601F are provided so that they are moved into and out of an illumination area by means of a drive system (not shown). In FIG. 13(a), the reference plates 601A to 601F stand outside the illumination area.

As shown in FIG. 13(c), the sizes of the reference plates 601A to 601F of this embodiment are reduced as compared with the reference plate 27 of the first embodiment, and the reference plates 601A to 601F are arranged on the left and right end portions of the reticle holder 4A', three plates on both portions respectively, at intervals of an equal distance in the Y direction. The reference plates 601A to 601F has cross-shaped reference marks 602A to 601F at their central portions, respectively.

In this embodiment, the image formation characteristics cannot be measured frequently during exposure. But, as shown in FIG. 13(b), at the time of the exchange of the reticle, the reference plates 601A to 601F are moved into the illumination area, and as with the first embodiment, the image formation characteristics such as magnification and image distortion can be detected with the reference marks 602A to 602F. The positions where the reference marks 602A to 602F are drawn have been strictly measured in advance, and the distance of movement of each of the reference plates 601A to 601F is strictly measured by a position sensor such as encoder (not shown) so that the plates 601A to 601F are accurately positioned. With this, the positions of the reference marks 602A to 602F are accurately measured, and as with the fourth embodiment, the measurement of the image formation characteristics can be performed independently of the reticle R.

Note that it is also conceivable to make the illumination area of the projection exposure apparatus sufficiently large with respect to the necessary exposure area of the reticle R. In such a structure, points to be considered remain in the aspect of cost and effect, but unlike this embodiment, the reference marks do not need to be arranged on the outer peripheral portion of the reticle R and also the reference plates 601A to 601F do not need to stand outside the illumination area.

Now, a seventh embodiment where the present invention is applied to a one-shot exposure type projection exposure apparatus will be described in reference to FIG. 14.

Figure 14:
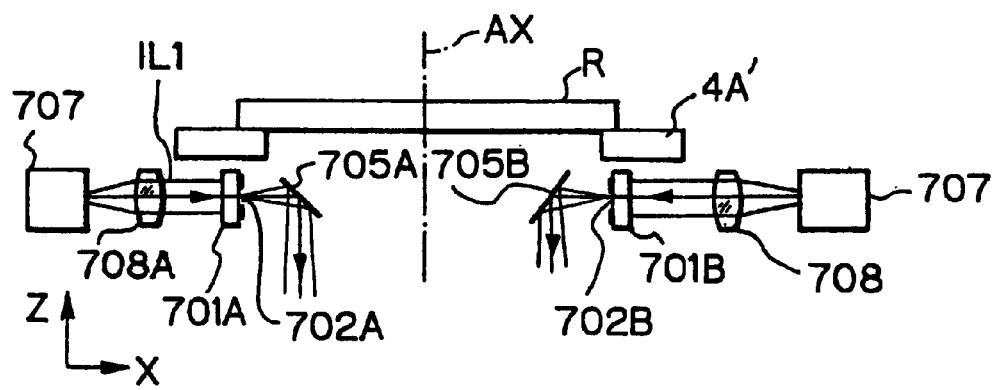
FIG. 14 is a view showing the peripheral constitution of a reticle stage for explaining still another embodiment of the projection exposure apparatus of the present invention.

FIG. 14 schematically illustrates the peripheral structure of a reticle stage of the projection exposure apparatus of this embodiment. In FIG. 14, mirrors 705A and 705B are provided under the left and right end portions of a reticle R mounted on a reticle holder 4A', respectively. The mirrors 705A and 705B are positioned outside an exposure area. Reference plates 701A and 701B having reference marks 702A and 702B formed thereon are arranged just under the left and right ends (in FIG. 14) of the reticle holder 4A' and on a plane which is conjugate with the pattern plane of the reticle R. Also, in this embodiment, in addition to an illumination system for exposure, another illumination system 707 is provided for illuminating the reference marks 702A and 702B of the reference plates 701A and 701B.

Illumination light beams IL1 from the illumination system 707 pass through condenser lens 708A and 708B and illuminate the back sides of the reference plates 701A and 701B, respectively. Then, the illumination light beams pass through the reference marks 702A and 702B and strikes upon the mirrors 705A and 705B. The illumination light beams reflected at right angles by the mirrors 705A and 705B and emitted parallel to the optical axis Ax pass through a lower projection optical system, enters into photoelectric detection systems provided on a wafer stage WST, and form images of the reference marks 702A and 702B.

The image forming positions of the reference marks 702A and 702B in the X directions are accurately measured in advance, and the measurement operation of the image forming characteristics is performed in the same way as the fourth embodiment. Although the foregoing is a structure for the measurement of the image forming characteristics in the X direction, reference plates and mirrors having a similar structure are also provided in the Y direction and the image formation characteristics in the Y direction are likewise measured.

Since in this embodiment the reference marks 702A and 702B have been illuminated by another illumination system which is different from the illumination system for exposure, a measurement error is caused by the difference between the illumination systems. This is because the position, where the light beam of the projection optical system PL passes through, varies due to a difference between illumination conditions and the manners in which the projection optical system PL undergoes aberration are different. But, if the illumination of the reference plates 701A and 701B is performed by the illumination system for exposure, an error such as described above will not occur. Also, if the mirrors 705A and 705B are provided so that they are freely movable, the mirrors can be moved away from the exposure area of the reticle R during exposure and the mirrors can be moved into the exposure area so that the image formation characteristics of the exposure area can be measured.

Figure 16:
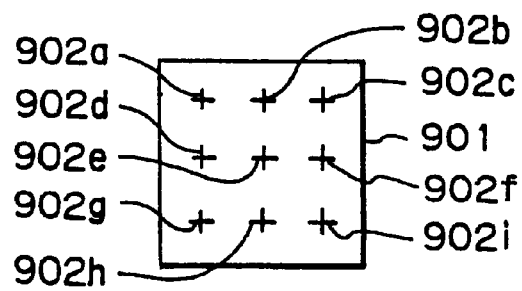
FIG. 16 is a view showing a modification of the reference plates used in the projection exposure apparatus of the embodiments of FIGS. 14 and 15.

Also, there may be provided a reference plate 901 having a plurality of reference marks 902a to 902i equally arranged in the vertical and horizontal directions, as shown in FIG. 16, and as with the fourth embodiment, the image formation characteristic may be measured based on a gap between the plurality of reference marks.

Now, an eighth embodiment where the present invention is applied to a one-shot exposure type projection exposure apparatus will be described with reference to FIG. 15.

Figure 15:
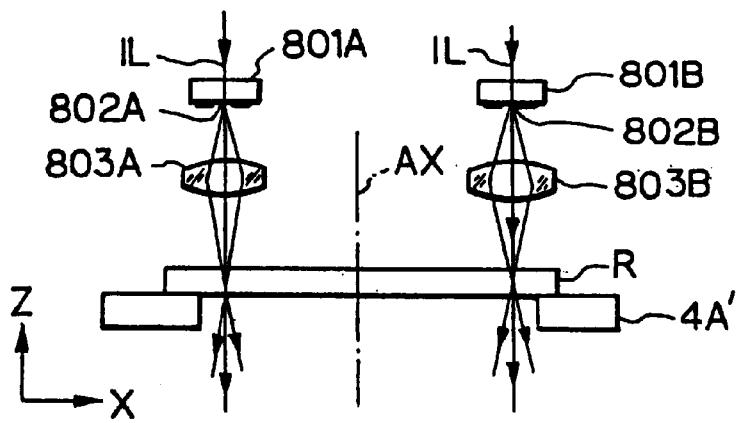
FIG. 15 is a view showing the peripheral constitution of a reticle stage for explaining a further embodiment of the projection exposure apparatus of the present invention.

FIG. 15 schematically illustrates the peripheral structure of a reticle stage of the projection exposure apparatus of this embodiment. In FIG. 15, a reference plate 801A having a reference mark 802A is arranged in parallel with the reticle R at a position which is above the left end (the end in the +X direction) of a reticle R mounted on a reticle holder 4A' and conjugates with the position of the reticle R. The reference plate 801A and a lens 803A under the reference plate 801A are provided so that the plate and the lens can be moved into and out of an exposure illumination area by a drive system not shown, and they an be moved out of the illumination area during exposure.

Also, a reference plate 801B having a reference mark 802B is arranged in parallel with the reticle R at a position which is above the right end (the end in the −X direction) of a reticle R mounted on a reticle holder 4A' and conjugates with the position of the reticle R. A lens 803B is disposed under the reference plate 801B.

At the time of measurement of the image formation characteristic, the reference mark 802A of the reference plate 801A or the reference mark 802B of the reference plate 801B is illuminated with illumination light for exposure, and a first image of the reference mark 802A or 802B is projected through the lens 803A or 803B on the reticle R. The projection positions of the first images of these reference marks 802A and 802B have been accurately measured in advance. As with the aforementioned embodiments, a projected image (second image) of the first image of the reference mark 802A or 802B through the projection optical system PL is detected by means of a photoelectric detection system, and as with first embodiment, the image formation characteristic is measured.

While in this embodiment there have been provided two reference measuring systems comprising a reference plate and a lens, a single reference measuring system may be provided. In such a case, the projection position on the reticle R is moved by moving the reference measuring system over a predetermined range, and a reference length on the reticle R can be measured by precisely measuring a distance between the projection positions. Also, as with the seventh embodiment, the image formation characteristics may be measured with the reference plate 901 of FIG. 16.

In this embodiment, since the reference plates 801A and 801B are arranged so that they can be moved into and out of a plane which is optically conjugate with the reticle R of the illumination optical system, the illumination system for the reference marks 802A and 802B and the illumination system for exposure becomes common. As with the seventh embodiment, an additional illumination system for reference marks may be provided if the conditions of the aforementioned two illumination systems are equal to each other. Note that, since in the method of this embodiment the characteristic of the lens 803 has an influence on the image formation characteristics of the projection optical system, consideration has to be given to the point.

While the measurement of the space image of the aforementioned embodiments other than the fifth embodiment has been performed by the light-receiving sensor provided on the wafer stage side, the light-receiving sensor may be provided in front of the reticle. In such a case, illumination light is emitted at the wafer stage side and received by the reticle.

When this modification is applied, for example, to the fourth embodiment, slit-shaped illumination is performed at the wafer stage side, and the wafer stage WST is scanned so that a slit scans the reference mark 207 of the reference plate 27 provided on the reticle stage. Since a beam of light passes through the reticle R upward when the reference mark 207 and the slit are aligned, the inverted image forming position of the slit to the reticle R can be known by receiving the transmitted light beam. However, since this method does not use an actual illumination system for the reticle R, consideration needs to be given to the fact that the method cannot cope with a variation in illumination conditions.

According to the first inspection method and apparatus of the projection optical system of the present invention, only a single predetermined pattern on the mask is used in the measurement of magnification and image distortion. Therefore, there is no influence of a drawing error of a pattern gap of the mask. As a result, since an accurate measurement of magnification and image distortion can be performed using, for example, masks for fabrication, there is the advantage that correction accuracy of magnification and image distortion can be enhanced by performing correction in accordance with the measurement.

According to the second inspection method and apparatus of the projection optical system of the present invention, the positional relationship between the first and second patterns formed on the mask can be accurately measured as needed, and consequently, the image formation characteristics of the projection optical system can be accurately detected at all times. Therefore, as with the first inspection method of the projection optical system of the present invention, the image formation characteristics of the projection optical system, such as magnification and image distortion, could be accurately detected even if drawing errors occurred in the mask marks for projection magnification and image distortion measurement.

In the first and second inspection methods and apparatuses of the projection optical system of the present invention, when the projection optical system is provided in a projection exposure apparatus where patterns formed on a mask is transferred on a photosensitive substrate, the image formation characteristics of the projection optical system can be accurately detected and the patterns of the mask can be accurately transferred on the photosensitive substrate.

According to the first projection exposure apparatus of the present invention, the first inspection method of the projection optical system can be carried out.

While the conventional exposure apparatus is also provided with a function for calculating and correcting a quantity of variation of the image formation characteristics, there is the possibility that an error occurs due to an unexpected long-term variation of the system, a difference between masks, a measurement error of the laser interferometer, and a difference between influences of illumination light absorption. Also, the variation characteristic of the image formation characteristics must be precisely obtained for each illumination condition, and furthermore, there is the problem that it takes time to regulate the system. However, if, with a mask which is used in actual exposure, a frequent calibration is performed according to the present invention with respect to the variation calculation, then an accurate correction can be performed, and the correction calculation will be sufficient if interpolation is performed during calibration and will not require high accuracy. For this reason, the present invention also has the advantage that the regulation of the illumination becomes simple.

According to the second projection exposure apparatus of the present invention, as with the first projection exposure apparatus of the present invention, the image formation characteristics of the projection optical system is measured without suffering the influence of the drawing error on the mask, by making use of the feature of the scanning-exposure type projection exposure apparatus, and based on the result, an accurate image formation characteristic can be maintained at all times by means of the correction device. Also, since the reference mark member is arranged on the mask stage in the scanning direction with respect to the mask, the reference mark member can be quickly moved to the exposure position of the mask by moving, for example, the mask stage. In addition, since the reference mark of the reference mark member is illuminated by illumination light of the same wavelength band as the illumination light for exposure, there is the advantage that the error of the image formation characteristic caused by a difference between illumination light beams is reduced, unlike the case where the reference mark is illuminated by illumination light of a wavelength band differing from the illumination light for exposure.

In the second projection exposure apparatus of the present invention, the reference mark member is arranged within an approach run section of the mask stage where the illumination light for exposure is illuminated, at the time of acceleration or deceleration during scanning and exposure. In such a case, there is no need for providing an additional place for the reference mark member. Also, since the illumination light for exposure can be used for illuminating the reference mark, there is no occurrence of a measurement error of the image formation characteristics, which is caused by a difference between illumination light beams.

In the first and second projection exposure apparatuses of the present invention, when the object to be detected by the image position detection device is an image projected through the projection optical system on a photosensitive or thermosensitive substrate for inspection, the image formation characteristic of the projection optical system can be accurately detected in the same state as actual exposure.

According to the third projection exposure apparatus of the present invention, the measurement of the image formation characteristics can be performed with a plurality of reference marks on the reference mark member formed separately from the mask, without using conventional reference patterns drawn on the mask. Therefore, the image formation characteristics can be accurately measured and corrected without undergoing the influence of the drawing error on the mask. Also, with this, the image formation characteristic could be accurately measured even if not only a test mask, where a drawing error of a reference pattern on a specific mask has been measured, but also a mask for fabrication were used. Therefore, the measurement and correction of the image formation characteristics can be frequently performed even during exposure, and consequently, an accurate image formation ability can be maintained at all times.

According to the fourth projection exposure apparatus of the present invention, the fourth inspection method of the projection optical system can be carried out.

In the fourth projection exposure apparatus of the present invention, the pattern position detection device has a pattern detection device for photoelectrically detecting patterns on the mask, a stage control device for moving said mask stage perpendicularly relative to an optical axis of the projection optical system so that the first and second patterns cross an area of detection of the pattern detection device, and a position measuring device for measuring a position of the mask stage. In such a case, the mask stage is moved by the stage control device, and the first and second patterns on the mask are detected by the pattern detection device. At this time, the position of the mask stage is detected by the position measuring device. In this way, the positional relationship between the first and second patterns can be detected.

Also, when the third and fourth projection exposure apparatuses of the present invention comprise a substrate stage for mounting a photosensitive substrate to which a predetermined pattern of the mask is transferred and also an example of an object to be detected by the image position detection device is an image of the predetermined pattern or first and second patterns transferred to the photosensitive substrate, the image formation characteristics of the projection optical system can be accurately detected in the same state as actual exposure.

In addition, when the third and fourth projection exposure apparatuses of the present invention are applied to a scanning-exposure type projection exposure apparatus, there is the advantage that they can be readily applied, because the feed mechanism of the mask stage originally provided can be utilized as it is.

Therefore, the present examples and embodiments are to be considered as illustrative and not restrictive and the invention is not to be limited to the details given herein, but may be modified within the scope of the appended claims.

What is claimed is:

1. A projection exposure apparatus to project a pattern formed on a mask onto a sensitive substrate through a projection optical system by synchronously scanning said sensitive substrate and said mask in a predetermined scanning direction, comprising:

a mask stage movable in said scanning direction while holding said mask;

a reference mark member having a plurality of reference marks and being disposed on said stage and arranged within an approach run section of said mask stage, wherein said approach run section is illuminated with an illumination light for exposure light at the time of acceleration or deceleration moving of said stage;

an image position detector to detect a position of a projection image of at least one of said plurality of reference marks obtained through said projection optical system under illumination light having the same wavelength band as the illumination light for exposure;

a calculator to obtain an image formation characteristic of said projection optical system, based on the result of the detection of said image position detector; and an adjuster to adjust the image formation characteristic of said projection optical system, based on the image formation characteristic obtained by said calculator.

2. A projection exposure apparatus which transfers a pattern formed on a mask onto a substrate through a projection optical system, comprising:

a mask stage, disposed on an object plane side of said projection optical system, which supports said mask;

a reference mark member, disposed on said mask stage, which is different from said mask and has a reference mark; and a non-electric, photosensitive material, disposed on an image plane side of said projection optical system, on which an image of said reference mark is formed through said projection optical system.

3. The projection exposure apparatus according to claim 2, wherein said photosensitive material is a material from which said formed image can be erased.

4. A scanning exposure apparatus which transfers a pattern formed on a mask onto a substrate through a projection optical system by synchronously scanning said substrate and said mask in a predetermined scanning direction, comprising:

a mask stage, disposed on an object plane side of said projection optical system, which is movable in said scanning direction while holding said mask; and a reference mark member, disposed on said mask stage and arranged within an approach run section of said mask stage, which has a reference mark, wherein said approach run section of said mask stage is passed through an illumination area of an exposure light at the time of acceleration or deceleration movement of said mask stage.

5. The scanning exposure apparatus according to claim 4, further comprising a detecting system, disposed on an image plane side of said projection optical system, which detects said reference mark through said projection optical system.

6. The scanning exposure apparatus according to claim 5, further comprising a correction system which adjusts said projection optical system based on the detected result by said detecting system.

7. A projection exposure apparatus which transfers a pattern formed on a mask onto a substrate through a projection optical system, comprising:

a mask stage, disposed on an object side of said projection optical system, which supports said mask;

a reference mark member, disposed on said mask stage, which is different from said mask and has a reference mark; and a driving device, connected to said reference mark member, which moves said reference mark member with respect to said mask stage.

8. A projection exposure apparatus in which a pattern formed on a mask is projected onto a sensitive substrate through a projection system, comprising:

a mask stage system including a mask stage which is movable and on which said mask is supported, an interferometer system which detects positional information of the mask stage, and a control system which controls a movement of the mask stage based on the detected positional information;

a reference member having a reference mark, disposed on said mask stage, which is different from the mask; and a detecting system including a detector which detects the reference mark through the projection system, and a calculator which obtains an image formation characteristic other than a magnification and a distortion based on an output of the detector.

9. An apparatus according to claim 8, wherein the detecting system includes a movable member which moves on an image plane side of the projection system, and a part of the detector is disposed on the movable member.

10. An apparatus according to claim 8, wherein said image formation characteristic other than the magnification and the distortion includes a coma.

11. An apparatus according to claim 8, wherein said image formation characteristic other than the magnification and the distortion includes a focus position.

12. An apparatus according to claim 8, wherein an imaging adjustment operation is performed on the basis of the obtained image formation characteristic.

13. An apparatus according to claim 8, wherein the mask and the substrate are moved synchronously in respective scanning directions during an exposure of the substrate.

14. An apparatus according to claim 13, wherein the reference member has a plurality of marks which are spaced from each other in the scanning direction of the mask.

15. An apparatus according to claim 13, wherein the reference member has a plurality of marks which are spaced from each other in a direction perpendicular to the scanning direction of the mask.

16. An apparatus according to claim 8, wherein the detecting system detects the reference mark during a mask exchange operation.

17. An apparatus according to claim 8, wherein the detector detects the reference mark while illuminating the reference mark with exposure light.

18. An apparatus according to claim 8, wherein the image formation characteristic is obtained in accordance with an illumination condition for the mask.

19. A scanning exposure apparatus in which a pattern formed on a mask is projected onto a sensitive substrate through a projection system while moving the mask and the substrate in respective scanning directions, comprising:

a mask stage system including a mask stage which is movable and on which said mask is supported, an interferometer system which detects positional information of the mask stage, and a control system which controls a movement of the mask stage based on the detected positional information; and a reference member, disposed within an approach run section on said mask stage, which is different from the mask and has a reference mark, wherein said approach run section is passed through an illumination area of an exposure beam at the time of acceleration or deceleration movement of the mask stage for a scanning exposure, and the scanning exposure operation for the sensitive substrate is performed based on information obtained by using the reference mark.

20. An apparatus according to claim 19, wherein the reference member has a plurality of marks which are spaced from each other in the scanning direction of the mask.

21. An apparatus according to claim 19, wherein the reference member has a plurality of marks which are spaced from each other in a direction perpendicular to the scanning direction of the mask.

22. An apparatus according to claim 19, further comprising:

a detecting system including a detector which detects the reference mark through the projection system and a calculator which obtains an image formation characteristic based on an output of the detector, said information obtained by using the reference mark including the image formation characteristic.

23. An apparatus according to claim 22, wherein the detecting system includes a movable member which moves on an image plane side of the projection system, and a part of the detector is disposed on the movable member.

24. An apparatus according to claim 22, wherein the detector detects the reference mark dung a mask exchange operation.

25. An apparatus according to claim 22, wherein the detector detects the reference mark while illuminating the reference mark with exposure light.

26. An apparatus according to claim 22, wherein an imaging adjustment operation is performed on the basis of the obtained image formation characteristic.

27. An apparatus according to claim 22, wherein the image formation characteristic is obtained in accordance with an illumination condition for the mask.

28. An exposure apparatus in which a pattern formed on a mask is projected onto a sensitive substrate through a projection system, comprising:

a mask stage system including a mask stage which is movable and on which said mask is supported, an interferometer system which detects positional information of the mask stage, and a control system which controls a movement of the mask stage based on the detected positional information; and a reference member which is disposed on said mask stage and is movable relative to the mask stage, the reference member being different from the mask and having a reference mark;

wherein an exposure operation for the sensitive substrate is performed based on information obtained by using the reference mark.

29. An apparatus according to claim 28, wherein the mask and the substrate are moved synchronously in respective scanning directions in the exposure operation.

30. An apparatus according to claim 29, wherein the reference member has a plurality of marks which are spaced from each other in the scanning direction of the mask.

31. An apparatus according to claim 29, wherein the reference member has a plurality of marks which are spaced from each other in a direction perpendicular to the scanning direction of the mask.

32. An apparatus according to claim 28, further comprising:

a detecting system including a detector which detects the reference mark through the projection system and a calculator which obtains an image formation characteristic based on an output of the detector, the information obtained by using the reference mark including the image formation characteristic.

33. An apparatus according to claim 32, wherein the detecting system includes a movable member which moves on an image plane side of the projection system, and a part of the detector is disposed on the movable member.

34. An apparatus according to claim 32, wherein the detector detects the reference mark during a mask exchange operation.

35. An apparatus according to claim 32, wherein the detector detects the reference mark while illuminating the reference mark with exposure light.

36. An apparatus according to claim 32, wherein an imaging adjustment operation is performed on the basis of the obtained image formation characteristic.

37. An apparatus according to claim 32, wherein the image formation characteristic is obtained in accordance with an illumination condition for the mask.

38. An exposure apparatus in which a pattern formed on a mask is projected onto a sensitive substrate through a projection system, comprising:

a mask stage system including a mask stage which is movable and on which said mask is supported, an interferometer system which detects positional information of the mask stage, and a control system which controls a movement of the mask stage based on the detected positional information;

a reference member which is disposed on said mask stage, the reference member being different from the mask and having a reference mark; and a detecting system which detects the reference mark during a mask exchange operation, wherein after the mask exchange operation, an exposure operation for the sensitive substrate is performed based on information obtained by detecting the reference mark.

39. An apparatus according to claim 38, wherein the mask and the substrate are moved synchronously in respective scanning directions in the exposure operation.

40. An apparatus according to claim 39, wherein the reference member has a plurality of marks which are spaced from each other in the scanning direction of the mask.

41. An apparatus according to claim 39, wherein the reference member has a plurality of marks which are spaced from each other in a direction perpendicular to the scanning direction of the mask.

42. An apparatus according to claim 38, wherein said detecting system detects the reference mark through the projection system to obtain an image formation characteristic, said information obtained by detecting the reference mark including the image formation characteristic.

43. An apparatus according to claim 42, wherein the detecting system includes a movable detector which moves on an image plane side of the projection system.

44. An apparatus according to claim 42, wherein the detecting system detects the reference mark while illuminating the reference mark with exposure light.

45. An apparatus according to claim 42, wherein an imaging adjustment operation is performed on the basis of the obtained image formation characteristic.

* * * * *